US012640339B2

(12) United States Patent　　　(10) Patent No.:　US 12,640,339 B2
Saitoh et al.　　　　　　　　　　(45) Date of Patent:　May 26, 2026

(54) ELECTRON MICROSCOPE, ABERRATION CORRECTION METHOD, AND IMAGING METHOD

(71) Applicant: JEOL Ltd., Tokyo (JP)

(72) Inventors: Motofumi Saitoh, Tokyo (JP); Ryusuke Sagawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 366 days.

(21) Appl. No.: 18/434,133

(22) Filed: Feb. 6, 2024

(65) Prior Publication Data

US 2024/0274402 A1　　Aug. 15, 2024

(30) Foreign Application Priority Data

Feb. 7, 2023　(JP) ................................. 2023-016927

(51) Int. Cl.
　　*H01J 37/26*　　　(2006.01)
　　*H01J 37/15*　　　(2006.01)
　　*H01J 37/153*　　(2006.01)
　　*H01J 37/22*　　　(2006.01)
(52) U.S. Cl.
　　CPC .......... *H01J 37/265* (2013.01); *H01J 37/153* (2013.01); *H01J 37/222* (2013.01); *H01J 2237/1532* (2013.01); *H01J 2237/1534* (2013.01); *H01J 2237/221* (2013.01)

(58) Field of Classification Search
CPC ...... H01J 37/265; H01J 37/153; H01J 37/222; H01J 2237/1532; H01J 2237/1534; H01J 2237/221
See application file for complete search history.

(56) References Cited

U.S. PATENT DOCUMENTS

2005/0072920 A1* 4/2005 Inada ...................... H01J 37/26
　　　　　　　　　　　　　　　　　　　　　　250/311

FOREIGN PATENT DOCUMENTS

JP　　　　2005108567 A　　4/2005

* cited by examiner

*Primary Examiner* — Nicole M Ippolito
(74) *Attorney, Agent, or Firm* — The Webb Law Firm

(57)　　　　ABSTRACT

An electron microscope includes an electron optical system, and a control unit that controls the electron optical system. The control unit performs processing for determining a standard deviation of a brightness distribution of an electron microscope image; processing for determining an optimum value of a parameter of the electron optical system such that the standard deviation becomes the maximum, by Gaussian process regression; and processing for capturing the electron microscope image with setting a value of the parameter to the optimum value. The control unit repeats the processing for determining the standard deviation, the processing for determining the optimum value, and the processing for capturing the electron microscope image to determine a value of the parameter.

14 Claims, 15 Drawing Sheets

| OPTICAL ELEMENT | RANGE | IMAGING MAGNIFICATION | IMAGE SIZE | ILLUMINATION TIME | FUNCTIONAL FORM | $\theta 1$ | $\theta 2$ | $\theta 3$ |
|---|---|---|---|---|---|---|---|---|
| OL | ±32 bits | 80M | 64×64 | 8μsec/pix | NORMALIZED GAUSSIAN + ERROR | 1 | 1 | 10 |
| CL Stig | ±1024 bits | 80M | 64×64 | 8μsec/pix | NORMALIZED GAUSSIAN + ERROR | 1 | 1 | 10 |
| CL2 Align | ±32 bits | 80M | 64×64 | 8μsec/pix | NORMALIZED GAUSSIAN + ERROR | 1 | 1 | 10 |

FIG. 3

ELECTRON MICROSCOPE, ABERRATION CORRECTION METHOD, AND IMAGING METHOD

CROSS-REFERENCE TO RELATED APPLICATION

This application claims priority to Japanese Patent Application No. 2023-016927, filed Feb. 7, 2023, the disclosure of which is hereby incorporated by reference in its entirety.

BACKGROUND OF THE INVENTION

Field of the Invention

The present invention relates to an electron microscope, an aberration correction method, and an imaging method.

Description of Related Art

Aberration correction is a critical technique to acquire a high resolution image with an electron microscope, such as a transmission electron microscope, a scanning transmission electron microscope, and a scanning electron microscope.

For example, as a method for correcting a focal point and astigmatism of an electron lens, JP-A-2005-108567 discloses a method for correcting a focal point and astigmatism based on the image sharpness of an electron microscope image.

However, in a case of correcting an aberration based on a shape of an image (e.g. image sharpness of an electron microscope image), as in the case of the aberration correction method disclosed in JP-A-2005-108567, the focal point and the astigmatism cannot be corrected accurately if the image is deformed due to drift of a specimen.

Further, in the case of sweeping a parameter (e.g. focal position) to search an optimum condition for an index (e.g. image sharpness) for an extreme value, as in the case of the method disclosed in JP-A-2005-108567, the following problem exists. That is, if there are a plurality of parameters to be adjusted, the index must be calculated for all the combinations of the parameters, which takes an enormous amount of time for correction. For example, in a case of sweeping three parameters under five conditions, the number of times of measurement and calculation becomes $5\times5\times5=625$. An increase in a number of times of measurement not only increases the time required for measurement, but also increases the electron beam illumination dose on a specimen and increases the damage to the specimen by electron beam illumination, and as a result, good microscopic observation becomes difficult.

SUMMARY OF THE INVENTION

According to a first aspect of the present disclosure, there is provided an electron microscope including:

an electron optical system; and a control unit that controls the electron optical system, the control unit performing:

processing for determining a standard deviation of a brightness distribution of an electron microscope image;

processing for determining an optimum value of a parameter of the electron optical system such that the standard deviation becomes the maximum, by Gaussian process regression; and processing for capturing the electron microscope image with setting a value of the parameter to the optimum value, and the control unit repeating the processing for determining the standard deviation, the processing for determining the optimum value, and the processing for capturing the electron microscope image to determine a value of the parameter.

According to a second aspect of the present disclosure, there is provided an aberration correction method used for an electron microscope including an electron optical system, the method including:

determining a standard deviation of a brightness distribution of an electron microscope image;

determining an optimum value of a parameter of the electron optical system such that the standard deviation becomes the maximum, by Gaussian process regression; and capturing the electron microscope image with setting a value of the parameter to the optimum value, a value of the parameter being determined by repeating the determining the standard deviation, the determining the optimum value, and the capturing the electron microscope image.

According to a third aspect of the present disclosure, there is provided an imaging method including:

correcting aberration of the electronic optical system by the above aberration correction method; and capturing an electronic microscope image having a number of pixels larger than a number of pixels of the electron microscope image which was captured in the capturing the electron microscope image.

According to a fourth aspect of the present disclosure, there is provided an imaging method including:

correcting aberration of the electron optical system by the above aberration correction method; and capturing an electron microscope image having an imaging magnification higher than an imaging magnification of the electron microscope image which was captured in the capturing the electron microscope image.

BRIEF DESCRIPTION OF THE DRAWINGS

FIG. 3 is a table illustrating conditions for correcting low-order aberration.

DESCRIPTION OF THE INVENTION

Figure 1:
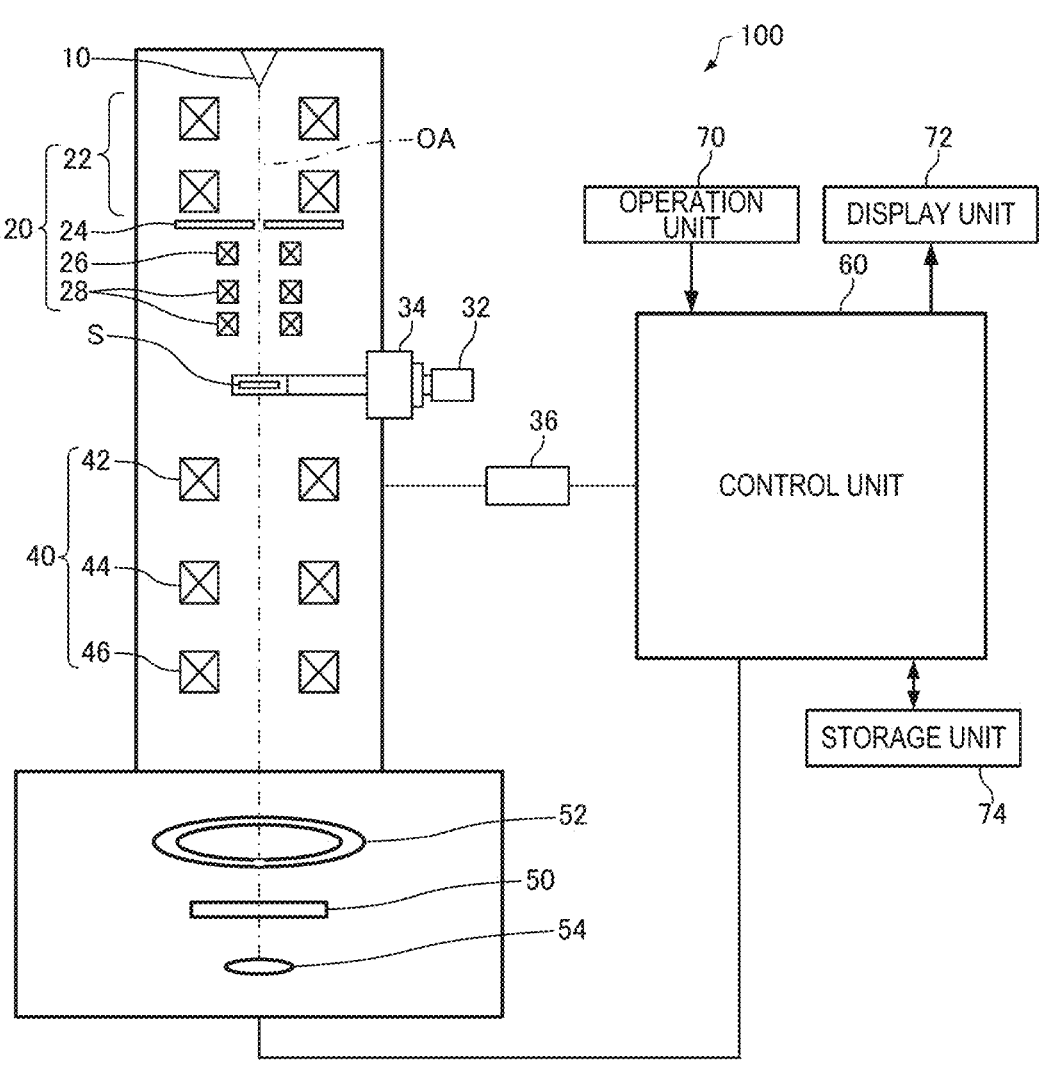
FIG. 1 is a diagram illustrating a configuration of an electron microscope according to Embodiment 1.

According to an embodiment of the present disclosure, there is provided an electron microscope including:

an electron optical system; and a control unit that controls the electron optical system, the control unit performing:

processing for determining a standard deviation of a brightness distribution of an electron microscope image;

processing for determining an optimum value of a parameter of the electron optical system such that the standard deviation becomes the maximum, by Gaussian process regression; and processing for capturing the electron microscope image with setting a value of the parameter to the optimum value, and the control unit repeating the processing for determining the standard deviation, the processing for determining the optimum value, and the processing for capturing the electron microscope image to determine a value of the parameter.

In this electron microscope, the control unit determines the optimum value of the parameter of the electron optical system, using the standard deviation of the brightness distribution of the electron microscope image as the index, hence the influence of drift of the specimen can be decreased compared with the case of correcting aberration based on the shape of the image of the electron microscope image, for example. Therefore in this electron microscope, aberration can be corrected more accurately.

Further, in this electron microscope, the optimum value of each parameter can be determined using a minimal number of parameter combinations, hence not only is the time for correction short and efficiency improves, but also damage to the specimen can be decreased.

According to an embodiment of the present disclosure, there is provided an aberration correction method used for an electron microscope including an electron optical system, the method including:

determining a standard deviation of a brightness distribution of an electron microscope image;

determining an optimum value of a parameter of the electron optical system such that the standard deviation becomes the maximum, by Gaussian process regression; and capturing the electron microscope image with setting a value of the parameter to the optimum value, a value of the parameter being determined by repeating the determining the standard deviation, the determining the optimum value, and the capturing the electron microscope image.

In this aberration correction method, the optimum value of the perimeter of the electron optical system is determined, using the standard deviation of the brightness distribution of the atomic microscope image as the index, hence the influence of drift of the specimen can be decreased compared with the case of correcting aberration based on the shape of the image of the electron microscope image, for example. Further, a repeat count can be dramatically decreased by using Gaussian process regression. Therefore in this aberration correction method, aberration can be corrected more accurately at higher speed.

According to an embodiment of the present disclosure, there is provided an imaging method including:

correcting aberration of the electronic optical system by the above aberration correction method; and capturing an electronic microscope image having a number of pixels larger than a number of pixels of the electron microscope image which was captured in the capturing the electron microscope image.

In this imaging method, an electron microscope image having higher number of pixels can be acquired in a state where aberration has been accurately corrected by the above mentioned aberration correction method. Further, in this imaging method, the time of capturing the electron microscope image used for aberration correction can be decreased.

According to an embodiment of the present disclosure, there is provided an imaging method including:

correcting aberration of the electron optical system by the above aberration correction method; and capturing an electron microscope image having an imaging magnification higher than an imaging magnification of the electron microscope image which was captured in the capturing the electron microscope image.

In this imaging method, an electron microscope image having a higher imaging magnification can be acquired in a state where aberration has been accurately corrected by the above mentioned aberration correction method. Further, in this imaging method, damage to the specimen caused by illuminating the electron beam can be decreased in capturing the electron microscope image used for aberration correction.

Now preferred embodiments of the invention will be described in detail with reference to the drawings. The embodiments described below are not intended to unduly limit the scope of the invention described in the claims. Further, all of the components described below are not necessarily essential requirements of the invention.

1. Embodiment 1

1.1. Electron Microscope

An electron microscope according to Embodiment 1 will be described first with reference to the drawings. FIG. 1 is a diagram illustrating a configuration of the electron microscope 100 according to Embodiment 1.

As illustrated in FIG. 1, the electron microscope 100 includes an electron source 10, an illumination optical system 20, a specimen holder 32, an image forming optical system 40, an imaging device 50, an annular detector 52, a detector 54, a control unit 60, an operation unit 70, a display unit 72, and a storage unit 74.

The electron microscope 100 can switch between a TEM mode and a STEM mode. In the TEM mode, a specimen image (TEM image) and an electron-diffraction pattern can be formed using the electrons transmitted through or diffracted by a specimen S, and the specimen image and electron-diffraction pattern can be captured by the imaging device 50. In the STEM mode, a specimen S can be scanned with a finely focused electron beam, and a STEM image (bright-field STEM image) can be acquired by detecting the electrons transmitted through the specimen S at each scanning position using the detector 54. A STEM image (dark-field STEM image) can also be acquired by scanning the specimen S with a finely focused electron beam, and detecting the electrons scattered by the specimen S at each scanning position using the annular detector 52.

The electron source 10 generates an electron beam. The electron source 10 is an electron gun, for example, which accelerates electrons, emitted from a cathode, using an anode, and emits an electron beam thereby.

The illumination optical system 20 illuminates the specimen S with the electron beam emitted from the electron source 10. The illumination optical system 20 includes, for example, a condenser lens 22, an aperture 24, a two-fold astigmatism corrector 26, and an axial coma aberration corrector 28.

The condenser lens 22 focuses an electron beam emitted from the electron source 10, and illuminates a specimen S therewith. In the electron microscope 100, an electron probe is formed by finely focusing the electron beam using the condenser lens 22 and the pre-magnetic field of the objective lens 42. In other words, in the STEM mode, the illumination optical system 20 includes a lens formed by the pre-magnetic field of the objective lens 42.

The two-fold astigmatism corrector 26 corrects the two-fold astigmatism of the condenser lens 22. For example, the two-fold astigmatism corrector 26 includes an X stigma coil for correcting the distortion of the electron beam in the X direction (first direction) and a Y stigma coil for correcting the distortion of the electron beam in the Y direction (second direction). The X direction and the Y direction are two axes which are orthogonal to each other, and are axes which are perpendicular to the optical axis OA of the electron optical system.

The axial coma aberration corrector 28 deflects an electron beam that enters a specimen S, and corrects the axial coma aberration. For example, the axial coma aberration corrector 28 includes an X alignment coil for correcting the inclination of the electron beam in the X direction (third direction), and a Y alignment coil for correcting the inclination of the electron beam in the Y direction (fourth direction).

Here the first direction in which the X stigma coil corrects the distortion and the third direction in which the X alignment coil inclines the electron beam are the same direction (X direction), but the first direction in which the X stigma coil corrects the distortion and the third direction in which the X alignment coil inclines the electron beam may be different. In the same manner, here the second direction in which the Y stigma coil corrects the distortion and the fourth direction in which the Y alignment coil inclines the electron beam are the same direction (Y direction), but the second direction in which the Y stigma coil corrects the distortion and the fourth direction in which the Y alignment coil inclines the electron beam may be different.

In the electron microscope 100, the electron probe is formed by finely focusing the electron beam using the condenser lens 22 and the pre-magnetic field of the objective lens 42, and this electron probe is two-dimensionally deflected by a scanning deflector (not illustrated). Thereby the specimen S can be scanned with the electron probe.

The aperture 24 (condenser aperture) cuts a part of the electron beam with which the specimen S is illuminated. For example, the aperture 24 has a plurality of aperture holes of which hole diameters are mutually different. By switching the aperture hole, an aperture angle and illumination dose of the electron beam can be adjusted.

The specimen holder 32 holds a specimen S. The front end of the specimen holder 32 supports the specimen S. The specimen holder 32 is attached to the microscope main unit via a goniometer 34. The goniometer 34 includes a driving mechanism that moves and inclines the specimen holder 32.

The image forming optical system 40 forms an image of electrons which transmitted through the specimen S. The image forming optical system 40 includes an objective lens 42, an intermediate lens 44, and a projection lens 46.

In the TEM mode, the image forming optical system 40 forms an electron diffraction pattern and a special image (TEM image) using electrons transmitted through the specimen S (transmitted electrons). For example, a specimen image can be formed on an object plane of the projection lens 46 by adjusting a focal point of the intermediate lens 44 on the specimen image (TEM image) formed by the objective lens 42. Thereby the imaging device 50 can capture the specimen image. Further, an electron diffraction pattern can be formed on the object plane of the projection lens 46 by changing the focal distance of the intermediate lens 44, and adjusting the focal point on the electron diffraction pattern formed by the objective lens 42. Thereby the imaging device 50 can capture the electron diffraction pattern.

In the STEM mode, the image forming optical system 40 guides electrons, which transmitted through the specimen S, into the detector 54, and guides electrons, which scattered by the specimen S, into the annular detector 52.

The illumination optical system 20 and the image forming optical system 40 constitute the electron optical system of the electron microscope 100.

The imaging device 50 captures a specimen image and an electron diffraction pattern formed by the image forming optical system 40. The imaging device 50 is a digital camera (e.g. charge coupled device (CCD) camera), for example. The TEM image and image data of the electron diffraction pattern, captured by the imaging device 50, are sent to the control unit 60, and stored in the storage unit 74.

The annular detector 52 detects electrons scattered by the specimen S. The annular detector 52 may be a detector to detect electrons which are inelastically scattered by the specimen S at a high angle, for example. Thereby a high angle annular dark-field STEM image (HAADF-STEM image) can be acquired.

The detector 54 detects electrons transmitted through the specimen S. A bright-field STEM image can be acquired by the detector 54 detecting electrons transmitted through the specimen S.

The operation unit 70 is for the user to input operation information, and outputs the inputted operation information to the control unit 60. The functions of the operation unit 70 will be implemented by such hardware as a keyboard, a mouse, buttons, a touch panel, and a touch pad.

The display unit 72 displays an image generated by the control unit 60. For example, a captured specimen image and electron diffraction pattern are displayed on the display unit 72. The functions of the display unit 72 can be implemented by a liquid crystal display (LCD), a cathode ray tube (CRT), a touch panel which also functions as the operation unit 70, or the like.

The storage unit 74 stores programs and various data for the computer to function as the control unit 60. The storage unit 74 also functions as a work area of the control unit 60. The functions of the storage unit 74 can be implemented by a random access memory (RAM), a hard disk, or the like.

The control unit 60 controls each component of the electron microscope 100, such as the electron source 10, the illumination optical system 20, the specimen holder 32, the goniometer 34, the image forming optical system 40, the imaging device 50, the annular detector 52, and the detector 54. The functions of the control unit 60 can be implemented by various parameters, such as a central processing unit (CPU) and a digital signal processor (DSP), executing programs.

1.2. Aberration Correction Method 1.2.1. Overview of Aberration Correction Method Low-order aberration, such as defocus, two-fold astigmatism and axial coma aberration, tend to fluctuate, and high-order aberration tends to be more stable. Therefore once the high-order aberration is adjusted, there is little need for readjustment until the observation and analysis end. The low-order aberration, however, requires readjustment in a short time. Hence it is preferable to correct the low-order aberration using a specimen that is actually observed, instead of using a dedicated specimen for aberration correction.

A known method for correcting aberration is a method using a Ronchigram. To obtain a Ronchigram, it is best to use an amorphous region of a specimen, and an aperture, of which diameter is larger than that of the aperture for capturing an atomic image, is required. Therefore after obtaining a Ronchigram from an amorphous region using an aperture having a large diameter and correcting the aberration thereby, the visual field is moved to a target region to be captured, with changing the aperture having a large diameter to an aperture having a small diameter, then the specimen is imaged. Since the conditions to obtain a Ronchigram and imaging conditions are different, it is preferable to correct the low-order aberration again when the image is captured.

In the case of the aberration correction method according to Embodiment 1, the low-order aberration is corrected using the standard deviation of the brightness distribution of the atomic image as the index. In other words, the index depends on whether or not a bright atomic image has been captured in a dark vacuum region in a clear contrast state. Therefore in the aberration correction method according to Embodiment 1, the low-order aberration can be corrected using a specimen actually observed, without using a dedicated specimen. Further, the standard deviation of the brightness distribution of the atomic image does not depend on the shape of the captured image and the type of the residual aberration. Hence if the standard deviation of the brightness distribution of the atomic image is used for the index to evaluate the aberration, the influence of the drift of the specimen can be decreased compared with the case of correcting the aberration based on the shape of the image, for example.

The standard deviation of the brightness distribution of the atomic image is acquired, for example, by extracting the brightness of each pixel of the atomic image, and calculating the standard deviation from the extracted brightness of each pixel. The atomic image used for the aberration correction is an annular dark-field STEM image (ADF-STEM image) acquired using the annular detector 52, for example. The atomic image used for the aberration correction may also be an HAADF-STEM image, for example.

Parameters of an optical element that are adjusted when the low-order aberration is corrected are: excitation of the objective lens 42; excitation of the X stigma coil (first excitation) and excitation of the Y stigma coil (second excitation) of the two-fold astigmatism corrector 26; an excitation of the X alignment coil (third excitation) and excitation of the Y alignment coil (fourth excitation) of the axial coma aberration corrector 28.

Hereafter, a current set value to excite the objective lens 42 is referred to as an OL value. A current set value to excite the X stigma coil of the two-fold astigmatism corrector 26 is referred to as an X stigma value, and a current set value to excite the Y stigma coil of the two-fold astigmatism corrector 26 is referred to as a Y stigma value. Further, a current set value to excite the X alignment coil of the axial coma aberration corrector 28 is referred to as an X alignment value, and a current set value to excite the Y alignment coil of the axial coma aberration corrector 28 is referred to as a Y alignment value.

In a case where there are two steps of alignment coils to incline the electron beam in the illumination optical system 20, that is, in a case where there are a first step alignment coil and a second step alignment coil, the axial coma aberration is corrected using the second step alignment coil, which can adjust the inclination of the illumination axis of the electron beam.

In the aberration correction method according to Embodiment 1, the low-order aberration is corrected by determining the optimum values of these five parameters. An optimum value of a parameter is a value with which the standard deviation of the brightness distribution of the atomic image becomes the maximum. The optimum value of the parameter is determined using the Gaussian process regression.

If a five-dimensional space, where each of these five parameters is one axis thereof, is searched, a number of combinations of the conditions becomes so high at the edge of the search region where probability to become an optimum value is low because dimensionality is high (curse of dimensionality), and the search becomes inefficient.

To prevent this, the five parameters are divided into a plurality of groups to decrease the dimensionality, and an optimum value is searched in each group respectively. The parameters are classified considering independency among the parameters. Here the classification methods based on two concepts will be described.

One of the two classification methods is a classification according to the order of aberration. If a low-order aberration remains, the high-order aberration is cancelled by the low-order aberration, and is less likely to appear. Therefore the parameters are classified from the lower order of aberration. The defocus and the two-fold astigmatism have a same order, but have different symmetric properties, and defocus has a stronger influence on the high-order aberration. Therefore an optimum value is searched in the sequence of the defocus, the two-fold astigmatism, and the axial coma aberration. For example, an optimum value is searched for in three separate groups: in the sequence of a one-dimensional space of the OL value alone, a two-dimensional space of the X stigma value and the Y stigma value, and a two-dimensional space of the X alignment value and the Y alignment value. An optimum value may also be searched in two separate groups: in the sequence of a three-dimensional space of the OL value, the X stigma value and the Y stigma value, and a two-dimensional space of the X alignment value and the Y alignment value.

The other of the two classification methods is a classification considering the correlation among the parameters. "Parameter X and Parameter Y are correlated" refers to a peak position acquired by sweeping in the X direction changes depending on the value of Y.

If the OL value is deviated, the beam shape may become similar to an atomic arrangement under a specific condition where the X stigma value and the Y stigma value are deviated from the optimum values, and the standard deviation may increase. This can occur in a case where there is an area in which atoms are arranged very close to each other, such as the case of the dumbbell structure acquired when the electron beam enters the Si mono crystal in the <110> direction, or in a case where the illumination optical system 20 does not include an aberration corrector and the diameter of the probe becomes as large as the inter-atomic spacing. In this case, the OL value, the X stigma value and the Y stigma value are correlated. In the case of the X alignment value and the Y alignment value, on the other hand, the correlation with the OL value is smaller than the case of the stigma values.

Therefore the optimum values may be searched by separating the parameters into two groups: the three dimensional space of the OL value, the X stigma value and the Y stigma value; and the two-dimensional space of the X alignment value and the Y alignment value. Further, the optimum values may also be searched by separating the parameters into three groups: the two-dimensional space of the OL value and the X stigma value; the two-dimensional space of the OL value and the Y stigma value; and the two-dimensional space of the X alignment value and the Y alignment value.

The selection between the classification method based on the order of aberration and the classification method based on the correlation among the parameters depends on the type of the specimen and the classification of the device. Hence the classification method that is used is determined in accordance with the type of the specimen and the configuration of the device.

As described above, the search count can be decreased by classifying the parameters first, then determining the optimum values of the parameters by the Gaussian process regression.

1.2.2. Flow of Aberration Correction

Figure 2:
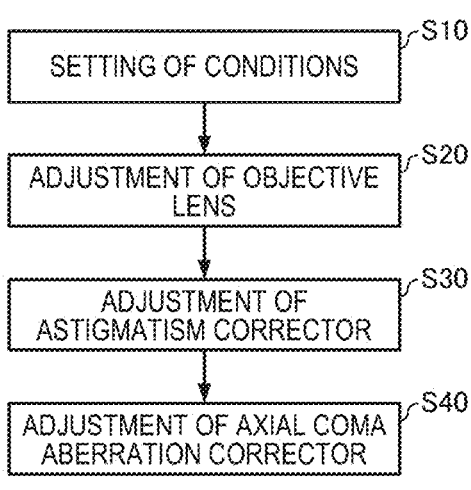
FIG. 2 is a flow chart illustrating an example of an aberration correction method for an electron microscope according to Embodiment 1.

FIG. 2 is a flow chart illustrating an example of the aberration correction method used for the electron microscope 100.

<Preparation>

Before correcting the low-order aberration, the high-order aberration is corrected, and the low-order aberration is roughly adjusted first. The correction of the high order aberration and the rough adjustment of the low-order aberration may be performed using a Ronchigram, for example, or by using a specimen image. Further, correction of the high-order aberration and the rough adjustment of the low-order aberration may be performed using a dedicated specimen.

For correction of the high-order aberration and the rough adjustment of the low-order aberration, a known aberration correction method, such as a segmental Ronchigram auto correlation function (SRAM) method using a Ronchigram, and a deconvolution method using a specimen image of a dedicated specimen, where gold particles are scattered on amorphous carbon, can be used. In the case of using the dedicated specimen, the specimen for observation is loaded onto the electron microscope 100 after performing the correction of the high-order aberration and the rough adjustment of the low-order aberration. Then in a region to observe the loaded specimen for observation, the orientation of the specimen (orientation of the specimen with respect to the incident direction of the electron beam) is aligned. In a case where the correction of the high-order aberration and the rough adjustment of the low-order aberration were performed using the SRAM method, the aperture for the Ronchigram is changed to the aperture for image capturing, and the visual field is moved, so that the atomic image can be captured.

<Setting of Conditions S10>

To correct the low-order aberration, a type of the optical element, a search range of the parameters of each optical element, imaging conditions of the atomic image, a functional form of Gaussian process regression, and hyperparameters are set.

FIG. 3 is a table illustrating the conditions of correction of the low-order aberration. The table in FIG. 3 illustrates a type of the optical elements, a search range of the set value of each optical element, imaging conditions, functional form of Gaussian process repression, and hyperparameters.

The optical elements to be adjusted are the objective lens 42 (OL), the two-fold astigmatism corrector 26 (CL Stig), and the X alignment coil and the Y alignment coil (CL2 Align) of the second step of the axial coma aberration corrector 28. Here optimum values are searched in the sequence of the defocus, the two-fold astigmatism, and the axial coma aberration. In other words, the optimum values are searched in three groups: the one-dimensional space of the OL value alone; the two-dimensional space of the X stigma value and the Y stigma value; and the two-dimensional space of the X alignment value and the Y alignment value. However, as mentioned above, the manner of grouping is not limited to this.

For the imaging conditions to capture the STEM image used for aberration correction, the imaging magnification, the image size, and the illumination time are set. The image size requires a certain number of pixels to calculate the standard deviation from the brightness distribution, and is preferably at least 32 pixels×32 pixels=1024 pixels. As the number of pixels increases, the standard deviation can be more accurately calculated, but it takes more time to capture the image, hence 512 pixels×512 pixels or less is preferable.

Further, in order to acquire an image with atomic resolution, the resolution of the image must be smaller than the inter-atomic spacing. Generally, the inter-atomic spacing is on the order of several hundred pm (picometers), hence magnification needs to be high enough to make the resolution of the image to be about a fraction of that, that is about 100 μm or less. However, if the magnification is too high, a number of atoms captured in the image decreases, and a number of atoms captured in the image changes depending on a slight difference in the image capturing position, and the standard deviation of the brightness distribution fluctuates. Therefore it is preferable that a number of pixels is within a certain range where a certain number of atoms are captured, and here, it is preferable that about several tens of atoms and about four periods of crystal lattice are captured. The imaging conditions need to satisfy these restrictions, and the lower limit of the imaging magnification is about 40 M (mega)x, and the upper limit, which depends on the number of pixels, is about 100 M (mega)x or less in the case of 32 pixels×32 pixels, although the specific conditions vary depending on the model. In the case of the example illustrated in FIG. 3, the imaging magnification is set to 80 Mx. The image size is 64 pixels×64 pixels. The illumination time of the electron beam to each pixel is about 10μ seconds or less. In the example illustrated in FIG. 3, the illumination time of the electron beam to each pixel is set to 8 u seconds. The appropriate imaging conditions to capture atomic images used for aberration correction depend on the performance of the device, the atomic arrangement of the specimen, and the like, hence conditions may be changed accordingly.

The search range of the set value of each optical element is expressed in bits in the example in FIG. 3. In Embodiment 1, the aberration correction is performed using a Ronchigram before performing the aberration correction using this method, hence the amount of aberration that remains in this stage is minimal. Therefore a narrow search range can be set. In the example in FIG. 3, the search range of the OL value is from −32 bits to +32 bits, which corresponds to from −20 nm to +20 nm of the defocus amount. In the example in FIG. 3, the search ranges of the X stigma value and the Y stigma value are from −1024 bits to +1024 bits, and the search ranges of the X alignment value and the Y alignment value are from −32 bits to +32 bits. This corresponds to about ±100 nm and ±1000 nm of aberration respectively. The appropriate search ranges depends on the state and reliability of the device, and the performance of the aberration correctors, hence these values may be changed accordingly.

In the example in FIG. 3, the functional form of the Gaussian process regression is set to a normalized Gaussian including an error (normalized Gaussian+error). Normalized Gaussian is the same type as the Gaussian kernel, and is a kernel function, multiplied by hyperparameters (coefficients) so that the form of the fitting function changes relatively when the search range or the fluctuation width of the standard deviation changes. The hyperparameters $\theta_1$, $\theta_2$ and $\theta_3$ will be described later.

The normalized Gaussian K including an error (Gaussian kernel K including an error), is expressed by the following Expression (1)

$$K_{ij} = \theta_1 \exp\left[-\theta_2(x_i - x_j)^2\right] + \theta_3 \delta_{ij} \ldots \qquad (1)$$

where $\theta_1$, $\theta_2$ and $\theta_3$ are hyperparameters, $x_i$ and $x_j$ are input variable vectors, and $\delta_{ij}$ is a Kronecker delta.

The optical elements are adjusted in the sequence of the smaller order of aberration, as mentioned above. That is, the sequence is: the adjustment of the objective lens 42, the adjustment of the two-fold astigmatism corrector 26, and the adjustment of the axial coma aberration corrector 28. However, the sequence of adjusting the optical elements may be changed in accordance with the specimen and the device.

<Adjustment of Objective Lens S20>

First the electron optical system is initialized, and the standard deviation of the brightness distribution of the atomic image is measured. Specifically, an atomic image of the specimen for observation is captured in the electron microscope 100 first. Imaging is performed under the imaging conditions indicated in FIG. 3. In other words, imaging is performed under the conditions of imaging magnification 80 Mx, image size 64 pixels×64 pixels, and illumination time of the electron beam to each pixel 8 u seconds. Thereby the atomic image for the specimen for observation can be acquired. Then from this captured atomic image, the standard deviation of the brightness distribution is determined. By the above steps, the standard deviation of the brightness distribution of the atomic image can be measured.

Then the OL value of the objective lens 42, with which the standard deviation becomes the maximum, is determined by the Gaussian process regression.

Specifically, in a graph of which abscissa is the OL value and the ordinate is the standard deviation of the brightness distribution of the atomic image, the measurement result of the standard deviation of the brightness distribution of the atomic image, which was captured with the OL value as the initial value, is plotted first. Then in the graph where the measurement point indicating the standard deviation when the OL value is the initial value is plotted, fitting is performed using a predetermined function and hyperparameters. Here the above Expression (1) is used for the predetermined function. For the hyperparameters, $\theta_1=1$, $\theta_2=1$ and $\theta_3=10$ are used.

Figure 4:
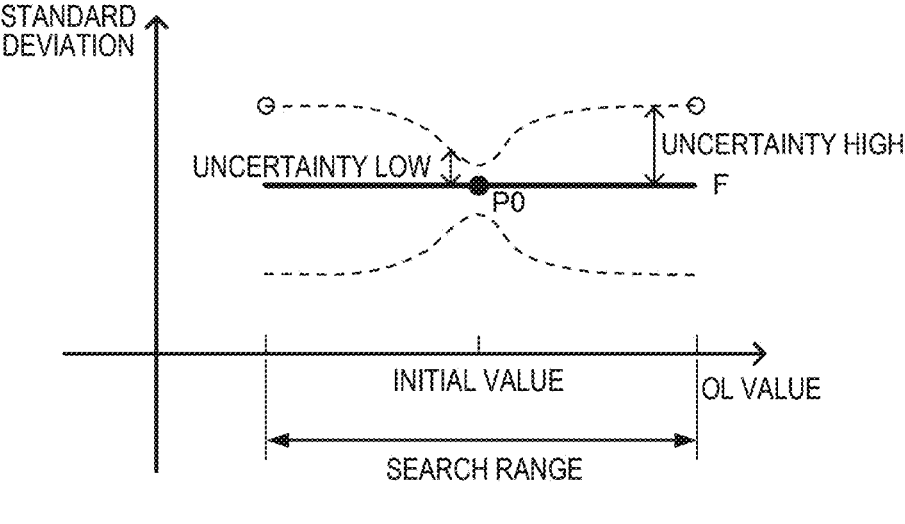
FIG. 4 illustrates a fitting result by a first Gaussian process regression.

FIG. 4 illustrates a fitting result after performing the first Gaussian process regression. In FIG. 4, the fitting function F of the fitting result is indicated by the solid line, and a confidence interval of +1σ and a confidence interval of −1σ are indicated by the broken lines respectively. In the graph in FIG. 4, a measurement point P0, which indicates the measurement result of the standard deviation of the brightness distribution of the atomic image, which was captured with the OL value as the initial value, is plotted. The initial value of the OL value is a value at the center of the search range, for example.

As illustrated in FIG. 4, by the Gaussian process regression, the fitting function F can be acquired as a prediction model to predict the relationship between the OL value and the standard deviation. Further, by the Gaussian process regression, the reliability of the OL value, which is predicted by the prediction model (fitting function F), can be determined.

The fitting function F is expressed by a line that passes through the measurement point P0, which indicates the standard deviation when the OL value is the initial value, and is parallel with the abscissa. The two broken lines indicate a range where the probability is ±1σ, that is, where the confidence interval is 1σ. In other words, this graph indicates that an error in a range indicated by the two broken lines is generated in the fitting result.

As described above, in the Gaussian process regression, not only is the fitting function F acquired, but also the reliability of the fitting result is acquired. In other words, in the Gaussian process regression, not only is the prediction model acquired, but also the reliability of the prediction result, predicted by the prediction model, can be acquired. Therefore if the Gaussian process regression is used, the search position to improve the accuracy of the fitting function F can be efficiently determined, and the peak can be efficiently searched.

The hyperparameters will be described here. $\theta_1$ is a parameter that indicates the maximum value of the confidence interval. As $\theta_1$ becomes greater, the confidence interval increases in general. For example, in FIG. 4, the distance between the solid line indicating the fitting function F and the broken lines indicating the confidence interval increases as $\theta_1$ becomes greater.

$\theta_2$ is a parameter that specifies how sharply the confidence interval and the fitting function F change. As $\theta_2$ becomes greater, a sharper change of the confidence interval and the fitting function F is allowed. $\theta_3$ is a parameter that indicates the level of noise (error) of the search data. In other words, $\theta_3$ is a parameter that indicates the size of the confidence interval at the measurement point. For example, if $\theta_3$ is set to zero in FIG. 4, the fitting function F and the two broken lines indicating the confidence interval pass through the measurement point P0. This means that if $\theta_3$ is set to zero, the confidence interval becomes zero at the measurement position.

As illustrated in FIG. 4, at the position where the OL value is the initial value, that is, at the measurement position where the standard deviation was actually measured, the confidence interval is small since the reliability is high. In other words, at the measurement position, the uncertainty of the fitting function F is small. The confidence interval increases as the position is more distant from the measurement position. That is, the uncertainty of the fitting function F increases as the position is more distant from the measurement position. Therefore, although the fitting function F is a line that is parallel with the abscissa, the confidence interval indicates that it is the positions at both ends of the search range where the standard deviation is likely to indicate the maximum value. In this way, the next search position is determined using an upper confidence bound (UCB) algorithm, which determines the next search position based on the confidence interval. For example, the position where the upper limit value of the confidence interval ($+1\sigma$ confidence interval becomes the maximum) is highly likely to be a position where standard deviation becomes the maximum. Therefore the position where the upper limit value of confidence interval becomes the maximum is determined as the optimum value of the OL value (that is, the next search position).

As illustrated in FIG. 4, the OL value of the objective lens 42, where the standard deviation is most likely to become the maximum (that is, the optimum value of the OL value) is at the positions at both ends of the search range. Therefore one of the values at both ends of the search range (that is, the lower limit value or the upper limit value of the search range) is determined as the optimum value of the OL value. The determined optimum value becomes the next search position to improve the accuracy of the fitting function F.

When the next search position is determined like this, the standard deviation of the brightness distribution of the atomic image is measured at the next search position. In other words, the standard deviation of the brightness distribution of the atomic image is measured with the OL value as the optimum value. The measurement of the standard deviation with the OL value as the optimum value is performed in the same manner as the above mentioned measurement of the standard deviation with the OL value as the initial value, except that the OL value is set as the optimum value this time. Here a case where the standard deviation is measured with the optimum value of the OL value as the lower limit value of the search range will be described.

Next the OL value of the objective lens 42, at which standard deviation becomes the maximum, is determined by the Gaussian process regression. Here, just like the first fitting illustrated in FIG. 4, $\theta_1=1$, $\theta_2=1$ and $\theta_3=10$ are used for the hyperparameters. The values of the hyperparameters $\theta_1$, $\theta_2$ and $\theta_3$ are fixed in this case, but the hyperparameters may be optimized using a known algorithm each time the fitting is repeated.

Figure 5:
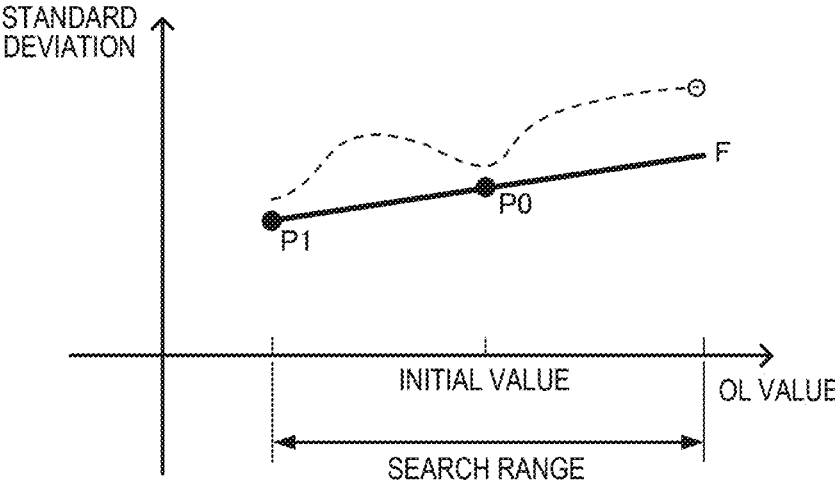
FIG. 5 illustrates a fitting result by a second Gaussian process regression.

FIG. 5 illustrates a fitting result after performing the second Gaussian process regression. In the graph illustrated in FIG. 5, the measurement point P0, and a measurement point P1, which indicates the measurement result of the standard deviation of the brightness distribution of the atomic image, which was captured with the OL value as the lower limit value of the search range, are plotted. In FIG. 5, the broken line indicating the confidence interval of $-1\sigma$ is omitted.

As illustrated in FIG. 5, by plotting the measurement point P1 in addition to the measurement point P0, the fitting function F is inclined, and the confidence interval also changes. Here the optimum value of the OL value, with which the standard deviation becomes the maximum, is the upper limit value in the search range of the OL value, as illustrated in FIG. 5. Therefore the upper limit value in the search range of the OL value is determined as the optimum value. In other words, the upper limit value in the search range of the OL value is determined as the next search position.

When the next search position is determined like this, the standard deviation of the brightness distribution of the atomic image is measured in the same manner at the next search position. In other words, the standard deviation of the brightness distribution of the atomic image is measured with the OL value as the optimum value (upper limit value of the search range). Then the OL value of the objective lens 42, with which the standard deviation becomes the maximum, is determined by the Gaussian process regression.

Figures 6, 7:
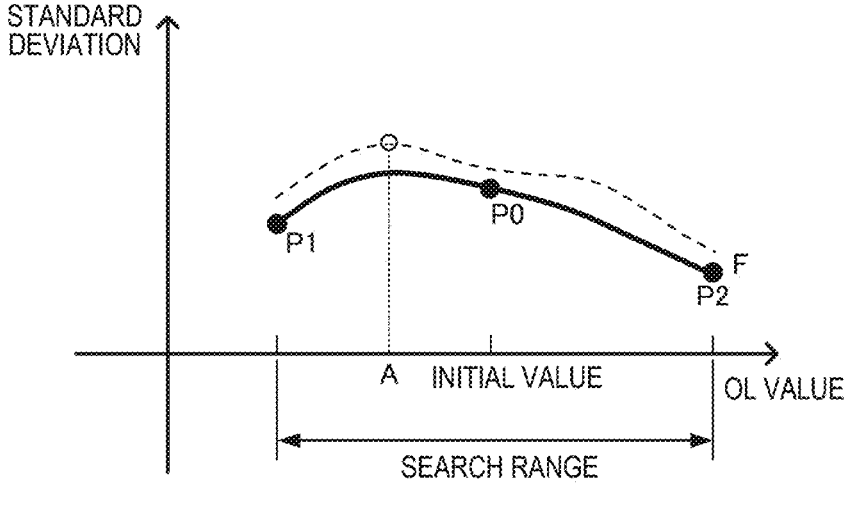
FIG. 6 illustrates a fitting result by a third Gaussian process regression.
FIG. 7 illustrates a fitting result by a fourth Gaussian process regression.

FIG. 6 illustrates a fitting result after performing the third Gaussian process regression. In the graph illustrated in FIG. 6, the measurement point P0, the measurement point P1, and the measurement point P2, indicating the measurement result of the standard deviation of the brightness distribution of the atomic image, which was captured with the OL value as the upper limit value of the search range, are plotted.

As illustrated in FIG. 6, by plotting the measurement point P2 in addition to the measurement point P0 and the measurement point P1, the fitting function F becomes a parabola. Based on the fitting result illustrated in FIG. 6, the optimum value of the OL value is determined. In the example illustrated in FIG. 6, the optimum value of the OL value is determined as the position of the OL value=A, considering the fitting function F and the confidence interval. For example, a position where the broken line of $+1\sigma$, which indicates the upper limit of the confidence interval, is determined as the optimum value of the OL value.

FIG. 7 illustrates a fitting result after performing the fourth Gaussian process regression. In the graph illustrated in FIG. 7, the measurement point P0, the measurement point P1, the measurement point P2, and a measurement point P3, indicating the measurement result of the standard deviation of the brightness distribution of the atomic image, which was captured with the OL value as OL value=A, are plotted.

In FIG. 7, the optimum value acquired as the fitting result after the fourth Gaussian process regression matches with the optimum value (OL value=A) acquired as the fitting result after the third Gaussian process regression. Therefore it is determined that the optimum value converged, and the OL value of the objective lens 42 is determined as OL value=A.

Here a region where the confidence interval is large exists in FIG. 7. Further, the confidence interval is also large in an area near the peak position (OL value=A) where the standard deviation is the maximum. The large confidence interval means that the fitting accuracy is not high. However, the purpose here is to search for a peak (maximum value). This purpose can be achieved if the peak position is reliable, even if the fitting accuracy is not high. As illustrated in FIG. 7, the determined optimum value matching with the previous optimum value means it is unlikely that a peak exists in the other positions. Therefore by the optimum value converging, the OL value of the objective lens 42, with which the standard deviation becomes the maximum, can be determined. By the above processing steps, the objective lens 42 can be adjusted.

The condition to end the adjustment of the objective lens 42 is not limited to the optimum value converging. For example, the adjustment of the objective lens 42 may be ended when the width of the confidence interval becomes smaller than a predetermined width throughout the search range.

In the case where the converged optimum value is located near the edge of the search range, it is likely that a true optimum value exists outside the search range. In this case, the search range shifted (e.g. shifting the search range to the smaller value side if the converged optimum value is the minimum value in the search range), and the same adjustment is performed again, then the true optimum value can be determined.

<Adjustment of Astigmatism Corrector S30>

Next the two-fold astigmatism corrector 26 is adjusted. First, the OL value of the objective lens 42 is set to the value determined in the adjustment of the objective lens 42 in S20, and the rest of the electron optical system is initialized, and the standard deviation of the brightness distribution of the atomic image is measured in that state. The standard deviation is measured in the same manner as the above mentioned measurement of the standard deviation in the adjustment of the objective lens 42 in S20.

Then the X stigma value and the Y stigma value of the two-fold astigmatism corrector 26, with which the standard deviation becomes the maximum, are determined by the Gaussian process regression.

Here in the adjustment of the two-fold astigmatism corrector 26, the X stigma value and the Y stigma value are adjusted simultaneously. In other words, the two-dimensional space of the X stigma value and the Y stigma value is searched. Therefore the fitting result by the Gaussian process regression becomes a three-dimensional graph.

Then the measurement result of the standard deviation of the brightness distribution of the atomic image, which was captured with the X stigma value and the Y stigma value as the initial values, is plotted in the three-dimensional graph, and fitting is performed. Fitting is performed in the same manner as the above mentioned search of the optimum value of the OL value, except that the graph here is the three-dimensional graph. As illustrated in FIG. 3, $\theta_1=1$, $\theta_2=1$ and $\theta_3=10$ are used for the hyperparameters.

Figure 8:
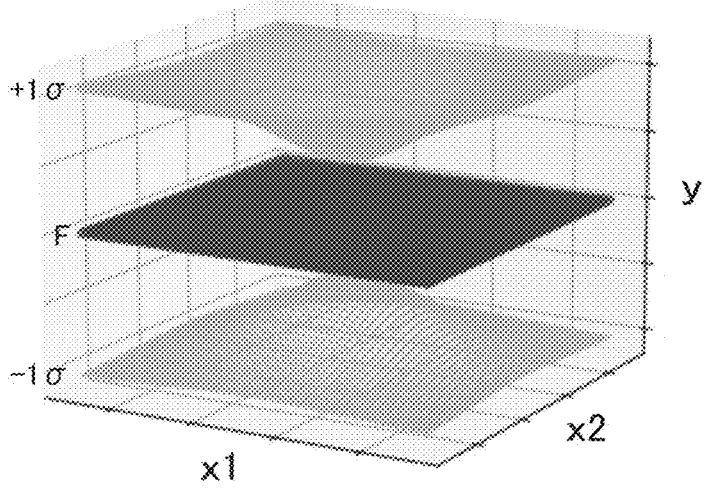
FIG. 8 illustrates a fitting result by a Gaussian process regression.

FIG. 8 illustrates a fitting result after performing the Gaussian process regression. In the graph in FIG. 8, the x1 axis indicates the X stigma value, the x2 axis indicates the Y stigma value, and the y axis indicates the standard deviation of the brightness distribution of the atomic image. In FIG. 8, the fitting function F and the confidence intervals of $\pm 1\sigma$ are illustrated.

As illustrated in FIG. 8, the X stigma value and the Y stigma value, with which the standard deviation is most likely to become the maximum (that is, the optimum values of the X stigma value and the Y stigma value), are at the four corner positions of the search range where the confidence interval becomes the upper limit value. Therefore the search positions of the X stigma value and the Y stigma value are determined at the four corner positions of the search range, and the standard deviation of the brightness distribution of the atomic image is measured at each position respectively.

Figure 9:
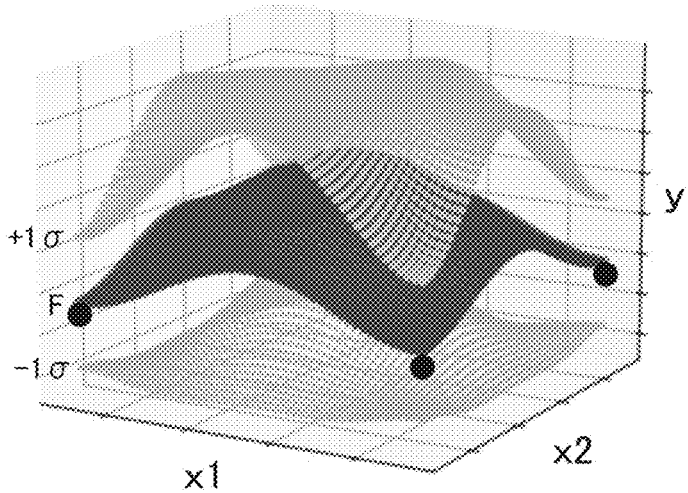
FIG. 9 illustrates a fitting result by a Gaussian process regression.

FIG. 9 illustrates a fitting result after performing the Gaussian process regression. In the graph in FIG. 9, the measurement points that indicate the measurement result of the standard deviation of the brightness distribution of the atomic image, which was captured with the X stigma value and the Y stigma value as the initial values, and the four measurement points that indicate the measurement result of the standard deviation of the brightness distribution of the atomic image which were captured respectively with the X stigma value and the Y stigma value as the four corner position, are plotted.

The optimum values of the X stigma value and the Y stigma value can be determined from the fitting result illustrated in FIG. 9. Thus the standard deviation of the brightness distribution of the atomic image is measured with the X stigma value and the Y stigma value as the optimum values, the optimum values of the X stigma value and the Y stigma value at which the standard deviation becomes the maximum are determined by the Gaussian process regression, the atomic image is captured again with this X stigma value and the Y stigma value as the optimum values, and the optimum values are converged by this repetition. For example, it is determined that the optimum values are converted when the determined optimum values match with the previous optimum values.

In this way, the X stigma value and the Y stigma value of the two-fold astigmatism corrector 26, with which the brightness distribution of the atomic image becomes the maximum, can be determined. By the above processing steps, the two-fold astigmatism corrector 26 can be adjusted.

<Adjustment of Axial Coma Aberration Corrector S40>

Next the axial coma aberration corrector 28 is adjusted. In the adjustment of the axial coma aberration corrector 28, the X alignment value and the Y alignment value are determined. The adjustment of the axial coma aberration corrector 28 is the same as the above mentioned adjustment of the two-fold astigmatism corrector 26, except that the parameters are the X alignment value and the Y alignment value, hence the description thereof will be omitted.

By the above processing steps, low-order aberration can be corrected.

1.2.3. Processing by Control Unit

<Processing to Correct Low-Order Aberration>

Figure 10:
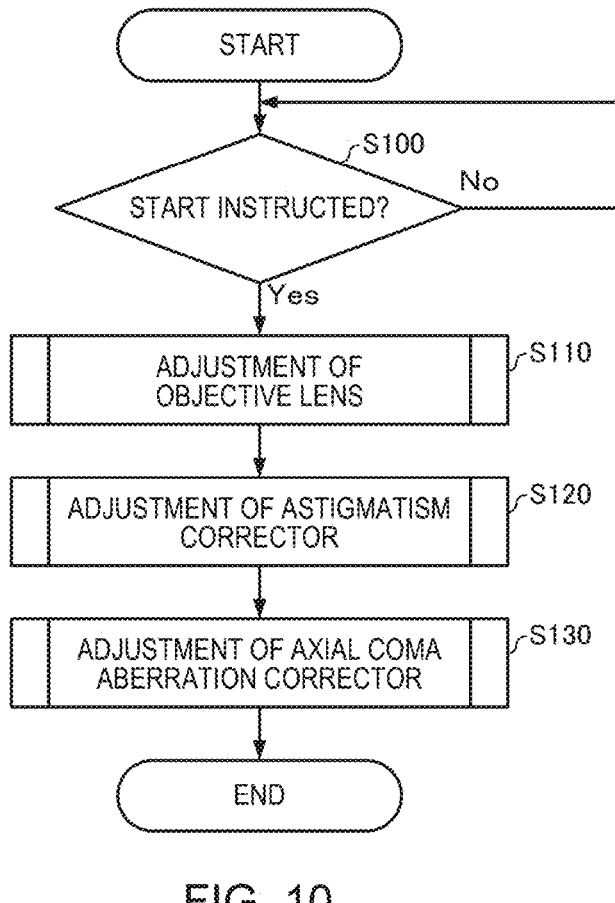
FIG. 10 is a flow chart illustrating an example of processing to correct low-order aberration by a control unit.

In the electron microscope 100, the control unit 60 performs processing to correct the low-order aberration. FIG. 10 is a flow chart illustrating an example of the processing to correct the low-order aberration by the control unit 60.

The control unit 60 determines whether or not the user instructed to start the correction of the low-order aberration (S100). It is determined that the user instructed to start the aberration correction in a case where an aberration correction start button is pressed, or an aberration correct start button of a graphical user interface (GUI) is operated, although these are not illustrated in the flow chart.

If it is determined that the user instructed to start the aberration correction (Yes in S100), the control unit 60 adjusts the objective lens 42 (S110).

After adjusting the objective lens 42, the control unit 60 adjusts the two-fold astigmatism corrector 26 (S120). After adjusting the two-fold astigmatism corrector 26, the control unit 60 adjusts the axial coma aberration corrector 28 (S130). After adjusting the axial coma aberration corrector 28, the control unit 60 ends the processing to correct the low-order aberration.

<Processing to Adjust Objective Lens>

Figure 11:
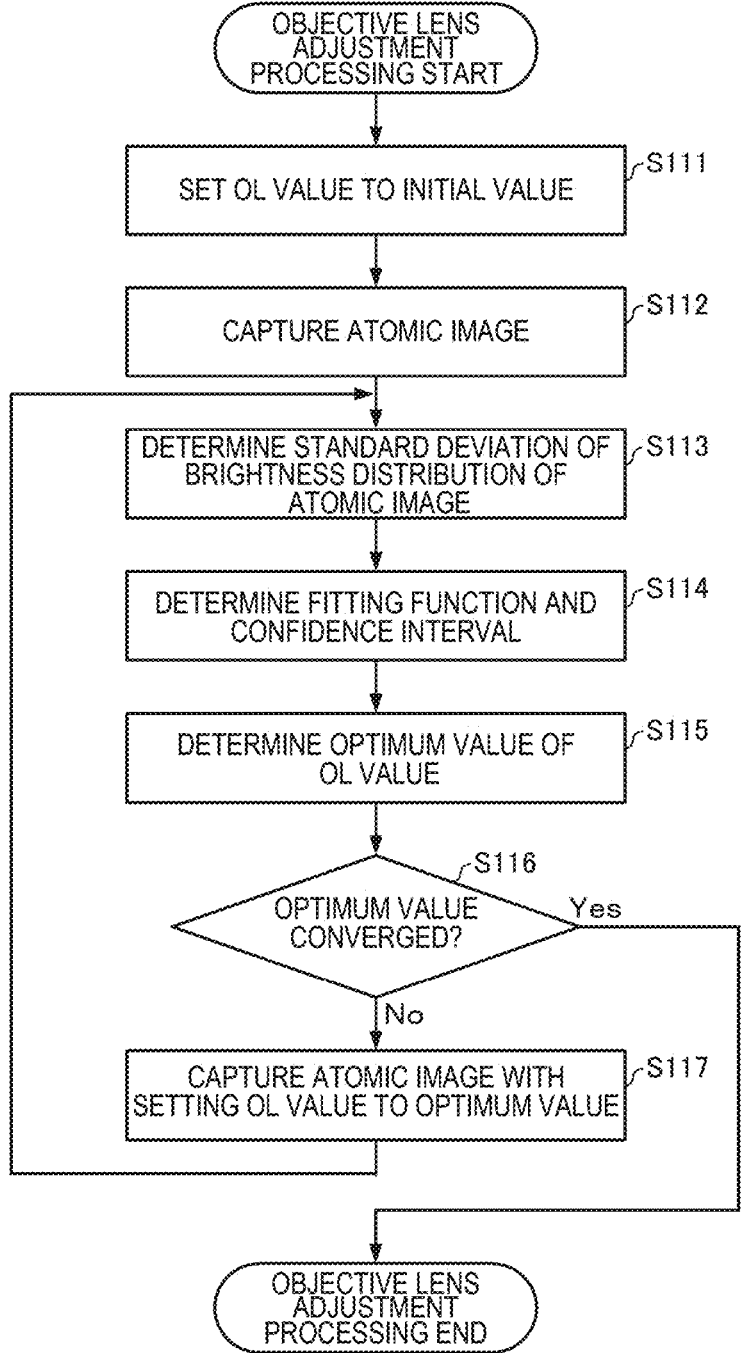
FIG. 11 is a flow chart illustrating an example of processing to adjust an objective lens by the control unit.

FIG. 11 is a flow chart illustrating an example of the processing S110 to adjust the objective lens 42 by the control unit 60.

The control unit 60 initializes the OL value of the objective lens 42 (S111), and captures an atomic image of a specimen S for observation (S112).

The control unit 60 determines the standard deviation of the brightness distribution of the captured atomic image (S113). Based on the determined standard deviation, the control unit 60 determines a fitting function F (prediction model), which predicts the relationship between the OL value and the standard deviation by the Gaussian process repression, and the confidence interval (reliability of the prediction result) thereof (S114).

Then based on the fitting function F and the confidence interval, the control unit 60 determines the optimum value of the OL value (S115). As illustrated in FIG. 4, FIG. 5 and FIG. 6, considering the fitting function F and the confidence interval, the control unit 60 determines an OL value, with which the standard deviation is likely to be the maximum, as the optimum value. For example, the control unit 60 determines the position in the confidence interval where the upper limit value is the maximum, as the optimum value of the OL value.

The control unit 60 determines whether or not the determined optimum value is converged (S116). For example, if the determined optimum value matches with the previously determined optimum value (or the initial value), the control unit 60 determines that the optimum value is converged.

If it is determined that the determined optimum value is not converged (No in S116), the control unit 60 captures an atomic image with the OL value as the optimum value determined in the processing S115 (S117). After capturing the atomic image (after processing S117), the control unit 60 returns to the processing S113 and determines the standard deviation of the brightness distribution of the atomic image (S113), determines the fitting function F, which predicts the relationship between the OL value and the standard deviation, by the Gaussian process regression, and the confidence interval thereof (S114), and determines the optimum value of the OL value based on the fitting function F and the confidence interval (S115).

In the processing S116, the control unit 60 repeats the processing S117 to capture the atomic image with the OL value as the optimum value, the processing S113 to determine the standard deviation of the brightness distribution of the atomic image, the processing S114 to determine the fitting function F and the confidence interval, and the processing S115 to determine the optimum value of the OL value, until it is determined that the optimum value is converged.

If it is determined that the optimum value is converged (Yes in S116), the control unit 60 ends the processing to adjust the objective lens 42. As a result of the processing to adjust the objective lens 42, the OL value of the objective lens 42 can be set to a value with which the standard deviation of the brightness distribution of the atomic image becomes the maximum.

<Processing to Adjust Astigmatism Corrector>

Figure 12:
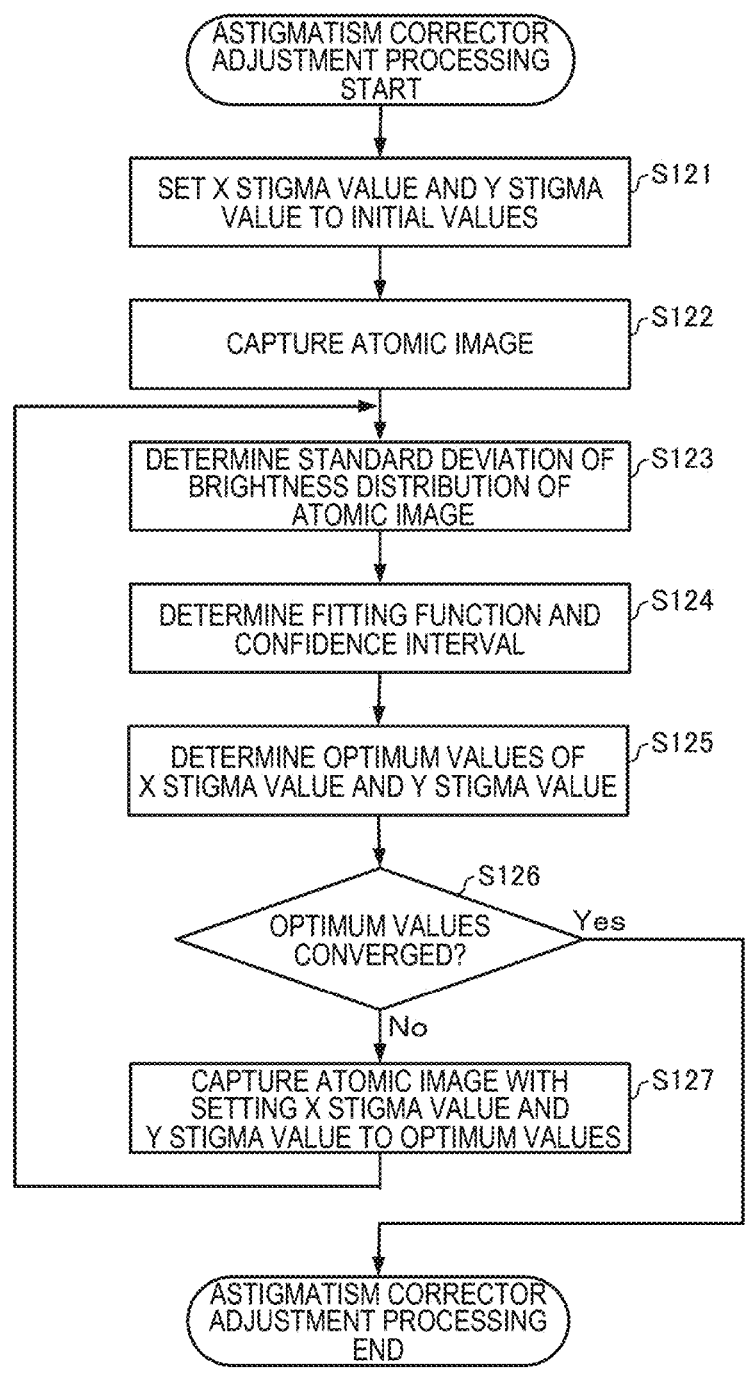
FIG. 12 is a flow chart illustrating an example of processing to adjust an astigmatism corrector by the control unit.

FIG. 12 is a flow chart illustrating an example of the processing S120 to adjust the two-fold astigmatism corrector 26 by the control unit 60.

The control unit 60 initializes the X stigma value and the Y stigma value of the two-fold astigmatism corrector 26 (S121), and captures an atomic image of the specimen S (S122).

The control unit 60 determines the standard deviation of the brightness distribution of the captured atomic image (S123). Based on the determined standard deviation, the control unit 60 determines the fitting function F (prediction model), which predicts the relationship between the X stigma value and the Y stigma value and the standard deviation by the Gaussian process regression, and the confidence interval (reliability of the prediction result) thereof (S124).

Then based on the fitting function F and the confidence interval, the control unit 60 determines the optimum value of the X stigma value and the optimum value of the Y stigma value (S125). As illustrated in FIG. 8 and FIG. 9, considering the fitting function F and the confidence interval, the control unit 60 determines an X stigma value and a Y stigma value, with which the standard deviation is likely to be the maximum, as the optimum values.

The control unit 60 determines whether or not the determined optimum values are converged (S126). For example, if the determined optimum values match with the previously determined optimum values (or the initial values), the control unit 60 determines that the optimum values are converged.

If it is determined that the determined optimum values are not converged (No in S126), the control unit 60 captures an atomic image with the X stigma value and the Y stigma value as the optimum values determined in the processing S125 (S127).

After capturing the atomic image (after the processing S127), the control unit 60 returns to the processing S123 and determines the standard deviation of the brightness distribution of the atomic image (S123), determines the fitting function F, which predicts the relationship between the X stigma value and the Y stigma value and the standard deviation, by the Gaussian process repression, and the confidence interval thereof (S124), and determines the optimum values of the X stigma value and the Y stigma value based on the fitting function F and the confidence interval (S125).

In the processing S126, the control unit 60 repeats the processing S127 to capture the atomic image with the X stigma value and the Y stigma value as the optimum values, the processing S123 to determine the standard deviation of the brightness distribution of the atomic image, the processing S124 to determine the fitting function F and the confidence interval, and the processing S125 to determine the optimum values of the X stigma value and the Y stigma value, until it is determined that the optimum values are converged.

If it is determined that the optimum values are converged (Yes in S126), the control unit 60 ends the processing to adjust the two-fold astigmatism corrector 26. As a result of the processing to adjust the two-fold astigmatism corrector 26, the X stigma value and the Y stigma value of the two-fold astigmatism corrector 26 can be set to values with which the standard deviation of the brightness distribution of the atomic image becomes the maximum.

<Processing to Adjust Axial Coma Aberration Corrector>

Figure 13:
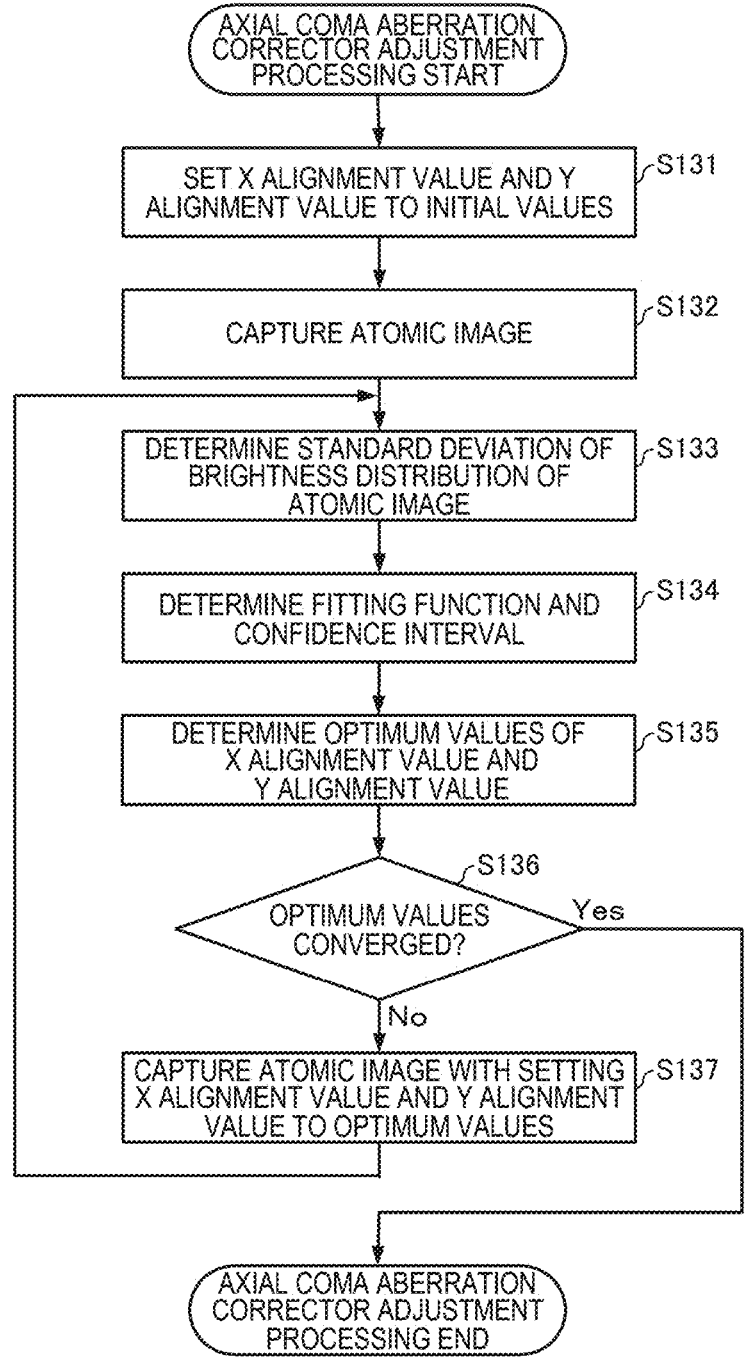
FIG. 13 is a flow chart illustrating an example of processing to adjust an axial coma aberration corrector by the control unit.

FIG. 13 is a flow chart illustrating an example of the processing S130 to adjust the axial coma aberration corrector 28 by the control unit 60.

The control unit 60 initializes the X alignment value and the Y alignment value of the axial coma aberration corrector 28 (S131), and captures an atomic image of the specimen S (S132).

The control unit 60 determines the standard deviation of the brightness distribution of the captured atomic image (S133). Based on the determined standard deviation, the control unit 60 determines the fitting function F (prediction model), which predicts the relationship between the X alignment value and the Y alignment value and the standard deviation by the Gaussian process regression, and the confidence interval (reliability of the prediction result) thereof (S134).

Then based on the fitting function F and the confidence interval, the control unit 60 determines the optimum value of the X alignment value and the optimum value of the Y alignment value (S135). Considering the fitting function F and the confidence interval, the control unit 60 determines an X alignment value and a Y alignment value, with which the standard deviation is likely to be the maximum, as the optimum values.

The control unit 60 determines whether or not the determined optimum values are converged (S136). For example, if the determined optimum values match with the previously determined optimum values (or the initial values), the control unit 60 determines that the optimum values are converged.

If it is determined that the determined optimum values are not converged (No in S136), the control unit 60 captures an atomic image with the X alignment value and the Y alignment value as the optimum values determined in the processing S135 (S137).

After capturing the atomic image (after the processing S137), the control unit 60 returns to the processing S133, and determines the standard deviation of the brightness distribution of the atomic image (S133), and determines the fitting function F, which predicts the relationship between the X alignment value and the Y alignment value and the standard deviation, by the Gaussian process regression, and the confidence interval thereof (S134), and determines the optimum values of the X alignment value and the Y alignment value based on the fitting function F and the confidence interval (S135).

In the processing S136, the control unit 60 repeats the processing S137 to capture the atomic image with the X alignment value and the Y alignment value as the optimum values, the processing S133 to determine the standard deviation of the brightness distribution of the atomic image, the processing S134 to determine the fitting function F and the confidence interval, and the processing S135 to determine the optimum values of the X alignment value and the Y alignment value, until it is determined that the optimum values are converged.

If it is determined that the optimum values are converged (Yes in S136), the control unit 60 ends the processing to adjust the axial coma aberration corrector 28. As a result of the processing to adjust the axial coma aberration corrector 28, the X alignment value and the Y alignment value of the axial coma aberration corrector 28 can be set to values with which the standard deviation of the brightness distribution of the atomic image becomes the maximum.

1.3. Imaging Method 1.3.1. Imaging of Electron Microscope Image

After correcting the low-order aberration of the electron optical system by the above mentioned aberration correction method illustrated in FIG. 2, a STEM image of a specimen S for observation is captured. Here a number of pixels of the STEM image is set to be larger than a number of pixels of the atomic image captured for the aberration correction. Thus in the imaging method used for the electron microscope 100, the image size of the STEM image, when the specimen S for observation is captured, can be larger than the image size of the atomic image captured for the aberration correction. In other words, the image size of the atomic image captured for the aberration correction can be smaller than the image size that is set for capturing the STEM image of the specimen S for observation. Therefore the time for capturing the atomic image used for the aberration correction can be decreased.

For example, in the imaging conditions for the aberration correction illustrated in FIG. 3, the image size is 64 pixels× 64 pixels, but in the imaging conditions for capturing the image of the specimen S for observation, the image size is set to be larger than 512 pixels×512 pixels.

1.3.2. Processing by Control Unit

After the processing to correct the low-order aberration illustrated in FIG. 10 ends, that is, after the adjustment processing of the axial coma aberration corrector 28 in S130 ends, the control unit 60 captures the STEM image of the specimen S. Here the control unit 60 sets the number of pixels of the STEM image to be larger than a number of pixels of the atomic image in the processing S117 to capture the atomic image in FIG. 11, the processing S127 to capture the atomic image in FIG. 12, or the processing S137 to capture the atomic image in FIG. 13. After capturing the STEM image, the control unit 60 ends the processing.

1.4. Effects

The electron microscope 100 includes the electron optical system which includes the illumination optical system 20, and the control unit 60 which controls the electron optical system. The control unit 60 performs: the processing to determine the standard deviation of the brightness distribution of the electron microscope image; the processing to determine the optimum values of the parameters of the electron optical system, with which the standard deviation of the brightness distribution of the electron microscope image becomes the maximum, by the Gaussian process regression; and the processing to capture an atomic microscope image with the values of the parameters as the optimum values, and determines the values of the parameters by repeating the processing to determine the standard deviation, the processing to determine the optimum values, and the processing to capture the electron microscope image.

In the processing to determine the optimum values, the control unit 60 determines a prediction model which predicts the relationship between the parameters and the standard deviation by the Gaussian process regression based on the standard deviation of the brightness distribution of the electron microscope image, and the reliability of the values of the parameters predicted by the prediction model, and determines the optimum values of the parameters based on the prediction model and the reliability.

In this way, the control unit 60 determines the optimum values of the parameters to correct the aberrations, using the standard deviation of the brightness distribution of the electron microscope image as an index. The standard deviation of the brightness distribution of an image does not depend on the shape of the image, hence the optimum values can be determined even if the resolution of the image is low. Therefore in the electron microscope 100, the electron microscope image can be captured quickly, and the aberration can be corrected in a short time. Further, the standard deviation of the brightness distribution of the image does not depend on the shape of the image, which means that even if the image is deformed by drift of the specimen, the influence thereof is minor. In other words, in the electron microscope 100, the influence of drift of the specimen can be decreased compared with the case of correcting the aberration based on the shape of the image, for example. Therefore in the electron microscope 100, aberration can be accurately corrected.

The control unit 60 also determines the optimum values of the parameters of the electron optical system, with which the standard deviation of the brightness distribution of the electron microscope image becomes the maximum, by the Gaussian process regression. Therefore in the electron microscope 100, the optimum values of the parameters can be efficiently determined. The reason for this will now be described in comparison with other methods.

As a method for searching a peak, like Gaussian process regression, a hill-climbing method, steepest descent method, a conjugate gradient method, and the like are known.

Figure 14:
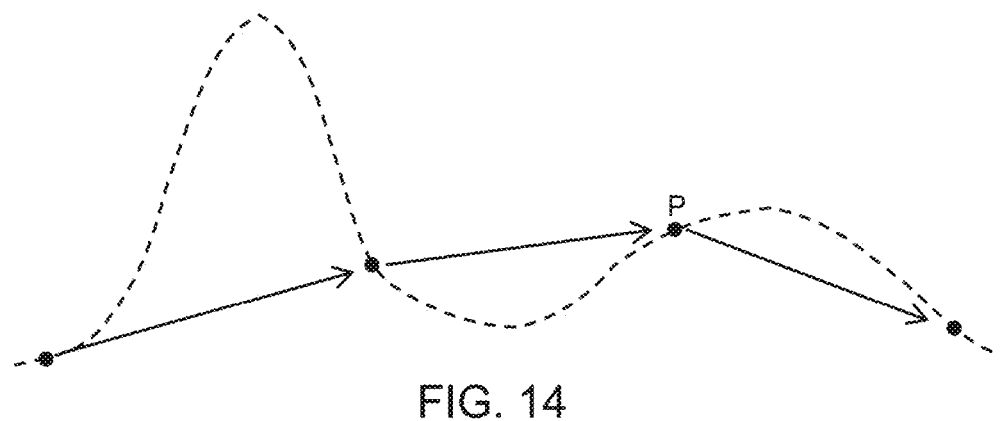
FIG. 14 is a diagram for describing a hill climbing method.
Figure 15:
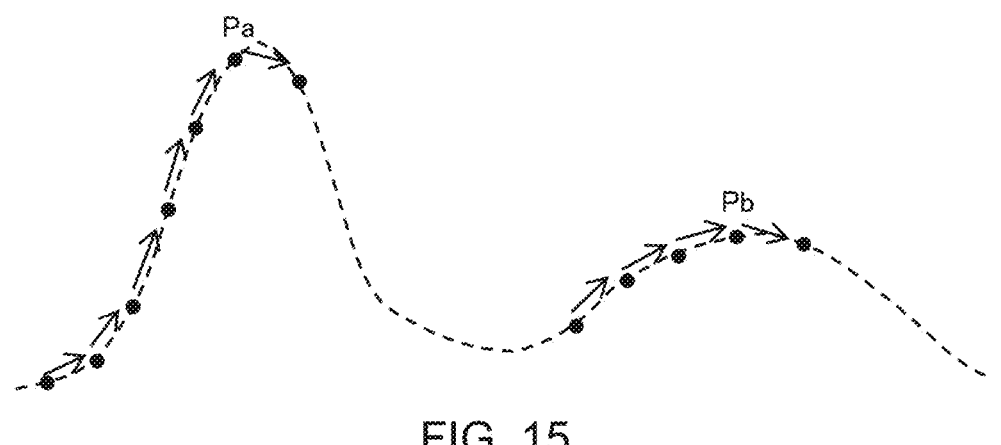
FIG. 15 is a diagram for describing a hill climbing method.
Figure 16:
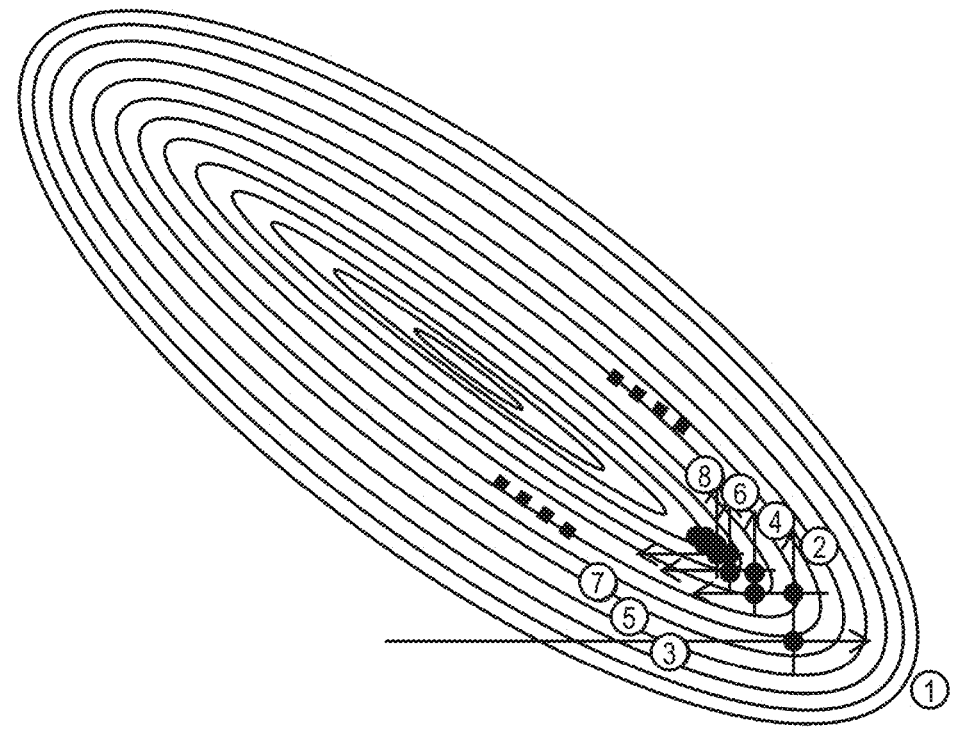
FIG. 16 is a diagram for describing a hill climbing method.

FIG. 14, FIG. 15 and FIG. 16 are diagrams for describing the hill-climbing method.

The hill-climbing method is an algorithm where from the start at an initial value, the peripheral area is searched in a predetermined direction with a predetermined step width, and if there is a better condition, the search condition is shifted to the better condition. In the hill-climbing method, however, the accuracy depends on the step width. Hence in the case of the hill-climbing method, the accuracy and the speed (number of trials) are in a tradeoff relationship. Further, as illustrated in FIG. 14, the peak, including the maximum value, is more likely not to be detected if the step width is large. In the case of the example in FIG. 14, a point P, which is not the peak, is detected as the peak because the step width is large. Further, if the initial value is not set appropriately, a local peak tends to be detected as the peak in error when the step width is small, as illustrated in FIG. 15. In the example in FIG. 15, a point Pa can be detected as the maximum value if the initial value is set appropriately, but a local peak point Pb is detected as the maximum value in error if the initial value is not set appropriately. Hence in the hill-climbing method, the peak is detected using a plurality of step widths, or by setting various initial values. A problem in this case is that a number of trials becomes high.

Another problem of the hill-climbing method is that convergence becomes difficult if the search direction is not appropriate, as illustrated in FIG. 16. In FIG. 16, a search direction is indicated by the arrow mark, and a detected peak position is indicated by a dot. Each dot, indicating a peak position, is numbered in the detected order.

As described above, the hill-climbing method is not suitable for aberration correction since the number of trials becomes high.

The steepest descent method and the conjugate gradient method were developed to improve on the problems of the hill-climbing method. In the steepest descent method and the conjugate gradient method, the search direction and the step width are determined using a gradient at a search position. Therefore the speed (number of trials) can be improved, and the problem on the difficulties of convergence, which occurs depending on the search direction, can be solved.

However, in the case of the steepest descent method and the conjugate gradient method, an image must be captured not only at the search position (x, y), but also at positions (x+dx, y) and (x, y+dy) in the vicinity thereof, in order to calculate the gradient. Further, a local peak or a position where the gradient becomes zero may be detected as the peak position in error.

Further, it is noise that becomes the obstacle to the search of the peak. The standard deviation is influenced by the brightness noise. If brightness noise exists, it is difficult to use the hill-climbing method since a local peak is generated. It is also difficult to use the steepest descent method and the conjugate gradient method if brightness noise exists, since calculation of a gradient becomes inaccurate.

The brightness noise can be reduced by making the illumination time of the electron beam longer, or by increasing the size of the imaging range. However, making the illumination time of the electron beam longer or increasing the size of the imaging range makes the imaging time longer. Therefore these solutions are not appropriate for aberration correction.

In the case of the Gaussian process regression, on the other hand, fitting is performed for the entire search range that is specified. Further, in the Gaussian process regression, the reliability of the fitting result can be calculated. Therefore, the search result is not influenced by the local peak and noise very much.

Generally in the case where a number of measurements points is small, accuracy of the fitting is low, and the maximum value cannot be determined based on the fitting result. However, in the Gaussian process regression, reliability of the fitting result (that is, uncertainty of the fitting result), can be calculated. Therefore if the upper limit value of the confidence interval does not exceed the maximum value of the fitting result at a certain position, it can be determined that the maximum value cannot exist at this position. If the upper limit value of the confidence interval exceeds the maximum value of the fitting result at a certain position, on the other hand, the maximum value is likely to exist at this position.

Therefore in the Gaussian process regression, the position at which the upper limit value of the confidence interval becomes the maximum can be preferentially measured, whereby the maximum value and this position can be efficiently searched. If the position at which the upper limit value of the confidence interval becomes the maximum has already been measured, neither the fitting result nor the confidence interval change even if this position is measured again. Therefore by repeating the converged result, the maximum value and the position thereof can be determined.

In this way, in the Gaussian process regression, the maximum value is searched in the entire search range, hence a local peak is detected as the peak in error. Also the measurement positions are not selected with a certain spacing, hence the maximum value can be searched for each minimum unit of the control width, regardless the size of the search range. Further, in the Gaussian process regression, the fitting and the confidence interval can be calculated considering an error (noise) of the measurement value, hence the result is not influenced by error very much.

In the Gaussian process regression, a kernel function is set and a hyperparameters used for the function are specified. The kernel function specifies how the confidence interval widens while moving away from the measurement point. There are various types of kernel functions, such as linear and Gaussian. The level of the noise to be considered is expressed by a constant term. The functional form can be selected as required.

A coefficient used for the kernel function, that is a hyperparameter, is directly related to the number of trails. In Embodiment 1, a case of fixing the hyperparameters was described, but the hyperparameters may be optimized each time a search is performed. The hyperparameter can be optimized using a known algorithm.

In the Gaussian process regression, a known value is assumed to be zero. Therefore if the standard deviation with the initial value is very large, a peak that is very large and sharp exists in the search range. In this case, the upper limit position (peak position) in the confidence interval may not change from the initial value. Hence instead of using the standard deviation itself as an index, the standard deviation from which the average value of the measured standard deviation is subtracted may be used as the index, or the difference between the measured standard deviation and the standard deviation with the initial value may be used as the index. Thereby the problem of determining the initial value as the peak position in error can be prevented.

In the electron microscope 100, the control unit 60 sets the parameter to the excitation of the objective lens 42 (OL value), and repeats the processing to determine the standard deviation, the processing to determine the optimum value, and the processing to capture the electron microscope image, as mentioned above, so as to determine the OL value and adjust the objective lens 42 thereby. Further, the control unit 60 sets the parameters to the excitation to correct the distortion of the electron beam in the X direction (X stigma value) and the excitation to correct the distortion of the electron beam in the Y direction (Y stigma value) in the two-fold astigmatism corrector 26, and repeats the processing to determine the standard deviation, the processing to determine the optimum values, and the processing to capture an electron microscope image, as described above, so as to determine the X stigma value and the Y stigma value and adjust the two-fold astigmatism corrector 26 thereby. Furthermore, the control unit 60 sets the parameters to the excitation to correct the inclination of the electron beam in the X direction (X alignment value) and the excitation to correct the inclination of the electron beam in the Y direction (Y alignment value) in the axial coma aberration corrector 28, repeats the processing to determine the standard deviation, the processing to determine the optimum values, and the processing to capture the electron microscope image, as described above, so as to determine the X alignment value and the Y alignment value and adjust the axial coma aberration corrector 28 thereby.

Since parameters are adjusted after being divided into three groups: the OL value; a group of the X stigma value and the Y stigma value; and a group of the X alignment value and the Y alignment value, the control unit 60 can correct aberrations efficiently.

In the correction of the low-order aberration, five parameters (OL value, X stigma value, Y sigma value, X alignment value and Y alignment value) are adjusted. Therefore the optimum values of the parameters can be determined by searching the five-dimensional space. However, as the dimensionality is increased, the more wasteful the search becomes due to the so called curse of dimensionality.

To prevent this, the five parameters are grouped for searching and adjustment. In the correction of the low-order aberration, the OL value and the stigma values (X stigma value and Y stigma value) are highly independent from each other. The OL value and the alignment values (X alignment value and Y alignment value) are highly independent from each other. The stigma values and the alignment values are also highly independent from each other. This means that the results of optimizing the X stigma value and the Y stigma value depend little on the OL value or the alignment values.

The X stigma value and the Y stigma value are not independent from each other, hence it is preferable to be searched and adjusted together. The X alignment value and the Y alignment value are not independent from each other as well, hence it is preferable to be searched and adjusted together.

Hence the parameters are grouped into three groups: the OL value; a group of the X stigma value and the Y stigma value; and a group of the X alignment value and the Y alignment value, and search and adjustment are performed for each group. By separating the parameters into three groups like this, wasteful search generated by the curse of dimensionality can be decreased, and aberration can be corrected efficiently.

The OL value is one-dimensional, so may be include in the group of the X stigma value and the Y stigma value, or may be included in the group of the X alignment value and the Y alignment value.

In the electron microscope 100, after the values of the parameters are determined, the control unit 60 performs processing to capture an electron microscope image having a higher number of pixels than the number of pixels of the electron microscope image captured in the processing to capture the electron microscope image. Therefore an electron microscope image having a large number of pixels can be acquired, and the imaging time to capture the electron microscope image used for the aberration correction can be decreased.

2. Embodiment 2

2.1. Electron Microscope

An electron microscope according to Embodiment 2 will be described next. The configuration of the electron microscope according to Embodiment 2 is the same as the electron microscope 100 according to Embodiment 1, and description thereof will be omitted. In the electron microscope 100 according to Embodiment 2, a composing element having the same function as the composing element of the electron microscope 100 according to Embodiment 1 will be denoted with the same reference sign, and detailed description thereof will be omitted.

2.2. Aberration Correction Method

In the electron microscope 100 according to Embodiment 2, the control unit 60 performs processing to determine whether or not a predetermined time has elapsed since the objective lens 42 was adjusted, processing to determine whether or not a predetermined time has elapsed since the two-fold astigmatism corrector 26 was adjusted, and processing to determine whether or not a predetermined time has elapsed since the axial coma aberration corrector 28 was adjusted, and this aspect is different from the electron microscope 100 according to Embodiment 1 described above. In the following, the aspects different from the electron microscope 100 according to Embodiment 1 will be described, and description on the same aspects as Embodiment 1 will be omitted.

Figure 17:
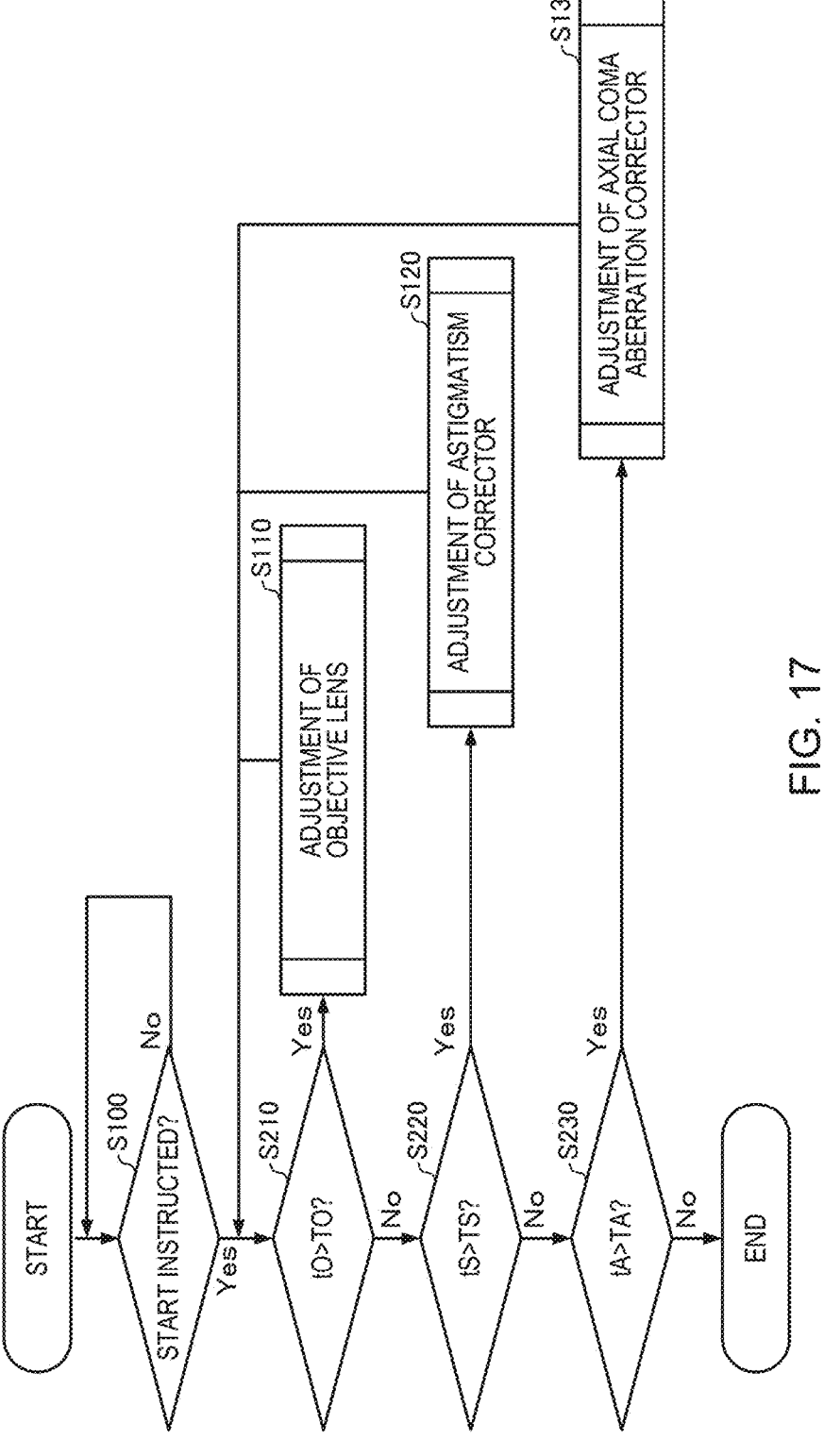
FIG. 17 is a flow chart illustrating an example of processing to correct low-order aberration by the control unit.

FIG. 17 is a flow chart illustrating an example of the processing to correct low-order aberration by the control unit 60 of the electron microscope 100 according to Embodiment 2.

The control unit 60 determines whether or not the user instructed to start the correction of the low-order aberration (S100). If it is determined that the user instructed to start the aberration correction (Yes in S100), the control unit 60 determines whether or not an elapsed time tO since the adjustment processing S110 of the objective lens 42 ended is longer than on elapsed time TO at which readjustment of the objective lens 42 is required (S210).

The optimum value of the OL value of the objective lens 42 changes over time. The elapsed time TO is set to a time in which the change of the optimum value of the OL value falls within a permissible range. For example, the control unit 60 starts measurement of the elapsed time tO at a timing when the adjustment processing S110 of the objective lens 42 illustrated in FIG. 11 ends. If the adjustment processing S110 of the objective lens 42 was never performed, the control unit 60 sets the elapsed time tO to a value larger than TO, such as infinity.

If it is determined that the elapsed time tO is longer than the elapsed time TO (Yes in S210), the control unit 60 performs the adjustment processing of the objective lens 42 illustrated in FIG. 11 (S110). After performing the adjustment processing of the objective lens 42 (after S110), the control unit 60 returns to the processing S210 and determines whether or not the elapsed time tO is longer than the elapsed time TO (S210).

If it is determined that the elapsed time tO is not longer than the elapsed time TO (No in S210), the control unit 60 determines whether or not an elapsed time tS since the adjustment processing S120 of the two-fold astigmatism corrector 26 ended is longer than an elapsed time TS at which readjustment of the two-fold astigmatism corrector 26 is required (S220).

The optimum value of the X stigma value and the optimum value of the Y stigma value of the two-fold astigmatism corrector 26 change over time. The elapsed time TS is set to a time in which the change of the optimum value of the X stigma value and the change of the optimum value of the Y stigma value fall within permissible ranges. For example, the control unit 60 starts the measurement of the elapsed time tS at a timing when the adjustment processing S120 of the two-fold astigmatism corrector 26 illustrated in FIG. 12 ends. If the adjustment processing S120 of the two-fold astigmatism corrector 26 was never performed, the control unit 60 sets the elapsed time tS to a value larger than TS, such as infinity.

If it is determined that the elapsed time tS is longer than the elapsed time TS (Yes in S220), the control unit 60 performs the adjustment processing of the two-fold astigmatism corrector 26 illustrated in FIG. 12 (S120). After performing the adjustment processing of the two-fold astigmatism corrector 26 (after S120), the control unit 60 returns to the processing S210 and determines whether or not the elapsed time tO is longer than the elapsed time TO (S210).

If it is determined that the elapsed time tS is not longer than the elapsed time TS (No in S220), the control unit 60 determines whether or not an elapsed time tA since the adjustment processing S130 of the axial coma aberration corrector 28 ended is longer than an elapsed time TA at which readjustment of the axial coma aberration corrector 28 is required (S230).

The optimum value of the X alignment value and the optimum value of the Y alignment value of the axial coma aberration corrector 28 change over time. The elapsed time TA is set to a time in which the change of the optimum value of the X alignment value and the change of the optimum value of the Y alignment value fall within permissible ranges. For example, the control unit 60 starts the measurement of the elapsed time tA at a timing when the adjustment processing S130 of the axial coma aberration corrector 28 illustrated in FIG. 13 ends. If the adjustment processing S130 of the axial coma aberration corrector 28 was never performed, the control unit 60 sets the elapsed time tA to a value larger than TA, such as infinity.

If it is determined that the elapsed time tA is longer than the elapsed time TA (Yes in S230), the control unit 60 performs the adjustment processing of the axial coma aberration corrector 28 illustrated in FIG. 13 (S130). After performing the adjustment processing of the axial coma aberration corrector 28 (after S130), the control unit 60 returns to the processing in S210, and determines whether or not the elapsed time tO is longer than the elapsed time TO (S210).

If it is determined that the elapsed time tA is not longer than the elapsed time TA (No in S230), the control unit 60 ends the processing to correct the low-order aberration.

2.3. Effects

In the electron microscope 100 according to Embodiment 2, the control unit 60 performs the processing to determine whether or not a predetermined time has elapsed since the processing to adjust the objective lens 42 was performed, and performs the processing to adjust the objective lens 42 again if it is determined that the predetermined time has elapsed. Therefore in the electron microscope 100 according to Embodiment 2, the influence of the time-related change of the optimum value of the OL value of the objective lens 42 can be decreased, and the low-order aberration can be accurately corrected.

Further, in the electron microscope 100 according to Embodiment 2, the control unit 60 performs the processing to determine whether or not a predetermined time has elapsed since the processing to adjust the two-fold astigmatism corrector 26 was performed, and performs the processing to adjust the two-fold astigmatism corrector 26 again if it is determined that the predetermined time has elapsed. Therefore in the electron microscope 100 according to Embodiment 2, the influence of the time-related change of the optimum value of the X stigma value and the optimum value of the Y stigma value of the two-fold astigmatism corrector 26 can be decreased, and the low-order aberration can be accurately corrected.

Further, in the electron microscope 100 according to Embodiment 2, the control unit 60 performs the processing to determine whether or not a predetermined time has elapsed since the processing to adjust the axial coma aberration corrector 28 was performed, and performs the processing to adjust the axial coma aberration corrector 28 again if it is determined that the predetermined time has elapsed. Therefore in the electron microscope 100 according to Embodiment 2, the influence of the time-related change of the optimum value of the X alignment value and the optimum value of the Y alignment value of the axial coma aberration corrector 28 can be decreased, and the low-order aberration can be accurately corrected.

2.4. Modification

Figure 18:
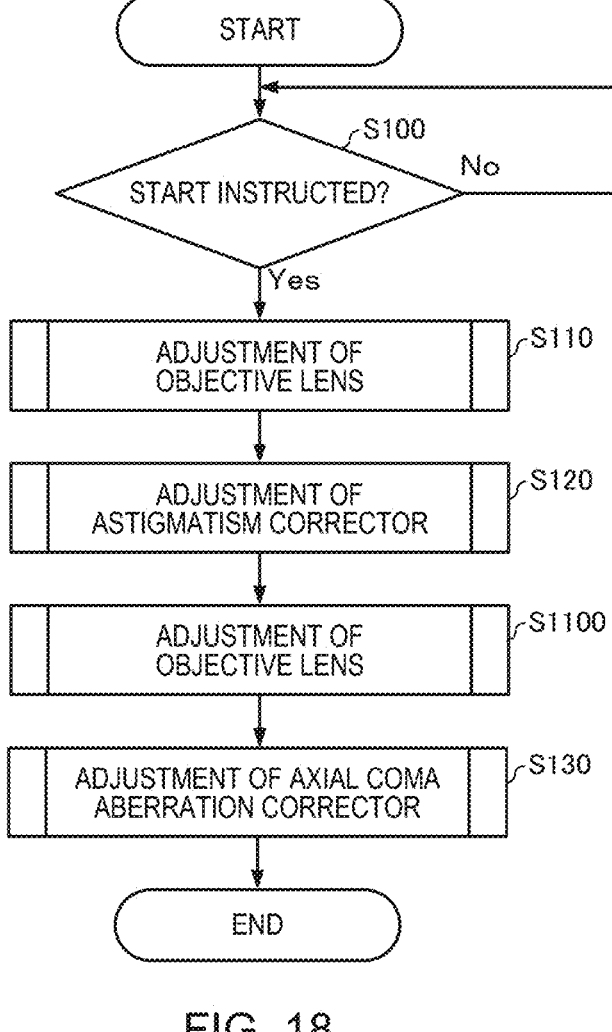
FIG. 18 is a flow chart illustrating a modification of the processing to correct low-order aberration by the control unit.

FIG. 18 is a flow chart illustrating a modification of the processing to correct low-order aberration by the control unit 60. In the following, the aspects different from the above mentioned example of the electron microscope 100 according to Embodiment 1 will be described, and description on the same aspects as Embodiment 1 will be omitted.

Compared with the optimum value of the X stigma value and the optimum value of the Y stigma value of the two-fold astigmatism corrector 26, and the optimum value of the X alignment value of the optimum value of the Y alignment value of the axial coma aberration corrector 28, the optimum value of the OL value of the objective lens 42 fluctuates more due to the time-related changes. Therefore, as illustrated in FIG. 18, the control unit 60 performs the adjustment processing S1100 of the objective lens 42 after performing the adjustment processing S110 of the objective lens 42 and the adjustment processing S120 of the two-fold astigmatism corrector 26. The adjustment processing S1100 of the objective lens 42 is performed in the same manner as the adjustment processing S110 of the objective lens 42. Thereby the influence of the time-related change of the optimum value of the OL value can be decreased, and low-order aberration can be accurately corrected.

After performing the adjustment processing S1100 of the objective lens 42, the control unit 60 performs the adjustment processing S130 of the axial coma aberration corrector 28.

3. Embodiment 3

3.1. Electron Microscope

An electron microscope according to Embodiment 3 will be described next. The configuration of the electron microscope according to Embodiment 3 is the same as the electron microscope 100 according to Embodiment 1, and the description thereof will be omitted. In the electron microscope 100 according to Embodiment 3, a composing element having the same function as the composing element of the electron microscope 100 according to Embodiment 1 will be denoted with the same reference sign, and detailed description thereof will be omitted.

3.2. Aberration Correction Method

In Embodiment 1 described above, the atomic image is captured setting the imaging magnification to about 80 Mx, and the low-order aberration is corrected using the standard deviation of the brightness distribution of the atomic image as the index. In Embodiment 3, on the other hand, the imaging magnification is set to a relatively low magnification, such as about 10 Mx. In such a STEM image of which magnification is relatively low, the interval of scanning becomes large, even if the size of the electron probe is sufficiently small, hence the atomic image cannot be observed clearly and moiré is observed.

The moiré in the STEM image is a periodic pattern generated by the overlapping of a scanning pattern generated when the specimen is scanned with the electron beam and an atomic arrangement pattern. Therefore the light and dark in moiré are the same as the light and dark of the image in which the atomic image can be clearly observed, and if the low-order aberration is corrected using the standard deviation of the brightness distribution of the moiré as the index, the same result as the case of correcting the low-order aberration using the standard deviation of the brightness distribution of the atomic image as the index can be acquired.

3.3. Imaging Method

Using the standard deviation of the brightness distribution of the moiré as the index, the control unit 60 performs the above mentioned processing to correct the low-order aberration illustrated in FIG. 10. Here in the processing S117 to capture the atomic image in FIG. 11, the processing S127 to capture the atomic image in FIG. 12, and the processing S137 to capture the atomic image in FIG. 13, the control unit 60 captures each image at a relatively low magnification, such as 10 Mx. Thereby the low-order aberration can be corrected using the standard deviation of the brightness distribution of the moiré as the index.

After ending the above mentioned processing to correct the low-order aberration illustrated in FIG. 10, the control unit 60 captures a STEM image of the specimen S. Here the imaging magnification is set to be higher than the imaging magnification in the above mentioned processing S117, processing S127 and processing S137. Thus in the imaging method used for the electron microscope 100, the imaging magnification to capture the image of the specimen S for observation can be set to be higher than the imaging magnification to capture the atomic image for aberration correction. In other words, the imaging magnification to capture the atomic image for aberration correction can be lower than the imaging magnification to capture the STEM image for the specimen S for observation. This means that a STEM image at high imaging magnification can be acquired in a state where aberration has been corrected, and also damage to the specimen S caused by illumination of the electron beam can be decreased when an atomic image is captured for aberration correction.

4. Embodiment 4

4.1. Electron Microscope

An electron microscope according to Embodiment 4 will be described next. The configuration of the electron microscope according to Embodiment 4 is the same as the electron microscope 100 according to Embodiment 1, and the description thereof will be omitted. In the electron microscope 100 according to Embodiment 4, a composing element having the same function as the composing element of the electron microscope 100 according to Embodiment 1 will be denoted with the same reference sign, and detailed description thereof will be omitted.

4.2. Aberration Correction Method

Figure 19:
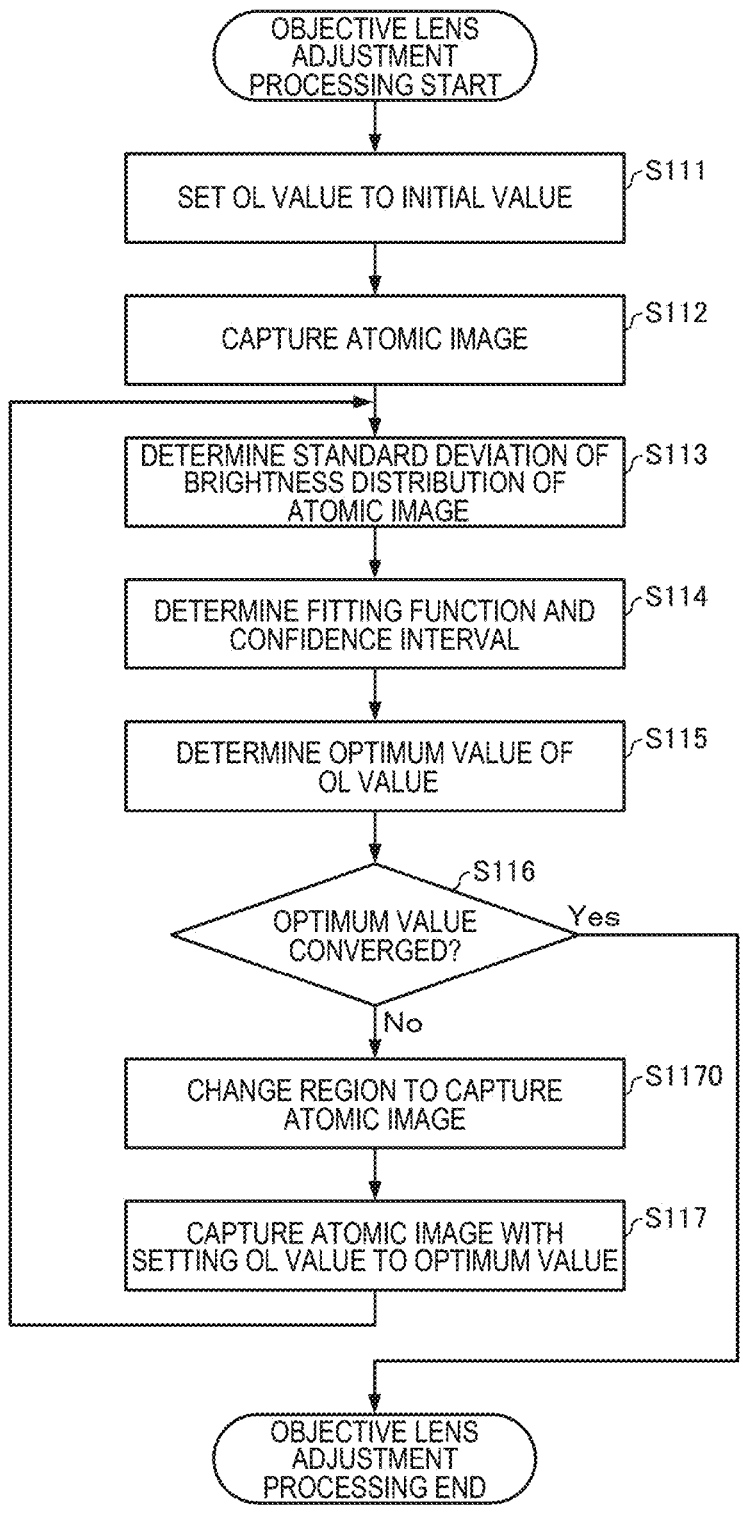
FIG. 19 is a flow chart illustrating a modification of the processing to adjust the objective lens by the control unit.

FIG. 19 is a flow chart illustrating a modification of the processing S110 to adjust the objective lens 42 by the control unit 60.

As illustrated in FIG. 19, the control unit 60 performs processing S1170 to change a region to capture an atomic image in the adjustment processing S110 of the objective lens 42. For example, after the processing S116 to determine whether or not the optimum value converged, and before the processing S117 to capture the atomic image, the processing S1170, to change the region to capture the atomic image, is performed. Thereby the region to capture the atomic image is changed each time the processing S113 to determine the standard deviation, the processing S114 to determine the fitting function F and the confidence interval, the processing S115 to determine the optimum value of the OL value, and the processing S117 to capture the atomic image are repeated. If there are two steps of the alignment coils in the axial coma aberration corrector 28, for example, the region to capture the atomic image can be changed using a first step of the alignment coils. The region to capture the atomic image may be changed by moving the specimen S using the goniometer 34.

The atomic image here is a periodic pattern, hence the standard deviation of the brightness distribution of the atomic image does not depend on the region to be imaged. Therefore even if the region to capture the atomic image is changed, the aberration correction is not influenced. By changing the region to capture the atomic image each time the processing steps are repeated, damage to the specimen S caused by illumination of the electron beam can be decreased.

The timing to perform the processing S1170, to change the region to capture the atomic image, is not especially limited, as long as it is performed during repeating the processing steps from the processing S113 to processing S117.

In the adjustment processing S120 of the two-fold astigmatism corrector 26 illustrated in FIG. 12 as well, the control unit 60 performs the processing to change the region to capture the atomic image in the same manner. Further, in the adjustment processing S130 of the axial coma aberration corrector 28 illustrated in FIG. 13 as well, the control unit 60 performs the processing to change the region to capture the atomic image in the same manner.

The above mentioned embodiments and modifications are examples, and the invention is not limited thereto. For example, each of the embodiments and modifications may be combined when necessary.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. An electron microscope comprising:
an electron optical system; and
a control unit that controls the electron optical system,
the control unit performing:
processing for determining a standard deviation of a brightness distribution of an electron microscope image;
processing for determining an optimum value of a parameter of the electron optical system such that the standard deviation becomes the maximum, by Gaussian process regression; and
processing for capturing the electron microscope image with setting a value of the parameter to the optimum value,
wherein the control unit repeats the processing for determining the standard deviation, the processing for determining the optimum value, and the processing for capturing the electron microscope image to determine a value of the parameter.

2. The electron microscope according to claim 1, wherein
in the processing for determining the optimum value, based on the standard deviation, the control unit determines a prediction model to predict a relationship between the parameter and the standard deviation by the Gaussian process regression, and reliability of a value of the parameter predicted by the prediction model, and
the control unit determines the optimum value based on the prediction model and the reliability.

3. The electron microscope according to claim 1, wherein
the electron optical system comprises:
an objective lens;
a two-fold astigmatism corrector to correct distortion of an electron beam; and
an axial coma aberration corrector to correct inclination of an electron beam, and
the control unit performs:
processing for repeating the processing for determining the standard deviation, the processing for determining the optimum value, and processing for capturing the electron microscope image, with setting the parameter to excitation of the objective lens, so as to determine a value of the excitation of the objective lens to adjust the objective lens;
processing for repeating the processing for determining the standard deviation, the processing for determining the optimum value, and the processing for capturing the electron microscope image, with setting the parameter to a first excitation to correct distortion of the electron beam in a first direction and a second excitation to correct distortion of the electron beam in a second direction which is different from the first direction, in the two-fold astigmatism corrector, so as to determine a value of the first excitation and a value of the second excitation to adjust the two-fold astigmatism corrector; and
processing for repeating the processing for determining the standard deviation, the processing for determining the optimum value, and the processing for capturing the electron microscope image, with setting the parameter to a third excitation to correct inclination of the electron beam in a third direction and a fourth excitation to correct inclination of the electron beam in a fourth direction which is different from the third direction, in the axial coma aberration corrector, so as to determine a value of the third excitation and a value of the fourth excitation to adjust the axial coma aberration corrector.

4. The electron microscope according to claim 3, wherein
the control unit performs:
processing for determining whether or not a predetermined time has elapsed since the objective lens was adjusted, and
processing for adjusting the objective lens again in a case where it is determined that the predetermined time has elapsed.

5. The electron microscope according to claim 1, wherein
the control unit changes a region of a specimen to capture the electron microscope image each time repeating the processing for determining the standard deviation, the processing for determining the optimum value, and the processing for capturing the electron microscope image.

6. The electron microscope according to claim 1, wherein
after determining a value of the parameter, the control unit performs processing for capturing an electron microscope image having a number of pixels larger than a number of pixels of the electron microscope image which was captured in the processing for capturing the electron microscope image.

7. The electron microscope according to claim 1, wherein
after determining a value of the parameter, the control unit performs processing for capturing an electron microscope image having an imaging magnification higher than an imaging magnification of the electron microscope image which was captured in the processing for capturing the electron microscope image.

8. An aberration correction method used for an electron microscope comprising an electron optical system, the method comprising:
determining a standard deviation of a brightness distribution of an electron microscope image;
determining an optimum value of a parameter of the electron optical system such that the standard deviation becomes the maximum, by Gaussian process regression; and
capturing the electron microscope image with setting a value of the parameter to the optimum value,
wherein a value of the parameter is determined by repeating the determining the standard deviation, the determining the optimum value, and the capturing the electron microscope image.

9. The aberration correction method according to claim 8, wherein
in the determining the optimum value, a prediction model to predict a relationship between the parameter and the standard deviation by the Gaussian process regression, and the reliability of a value of the parameter predicted by the prediction model are determined based on the standard deviation, and the optimum value is determined based on the prediction model and the reliability.

10. The aberration correction method according to claim 8, wherein the electron optical system comprises:

an objective lens;

a two-fold astigmatism corrector to correct distortion of an electron beam; and an axial coma aberration corrector to correct inclination of an electron beam, and the aberration correction method comprises:

repeating the determining the standard deviation, the determining the optimum value, and the capturing the electron microscope image, with setting the parameter to excitation of the objective lens, so as to determine a value of excitation of the objective lens to adjust the objective lens;

repeating the determining the standard deviation, the determining the optimum value, and the capturing the electron microscope image, with setting the parameters to a first excitation to correct distortion of the electron beam in a first direction and a second excitation to correct distortion of the electron beam in a second direction which is different from the first direction, in the two-fold astigmatism corrector, so as to determine a value of the first excitation and a value of the second excitation to adjust the two-fold astigmatism corrector; and repeating the determining the standard deviation, the determining the optimum value, and the capturing the electron microscope image, with setting the parameters to a third excitation to correct inclination of the electron beam in a third direction and a fourth excitation to correct inclination of the electron beam in a fourth direction which is different from the third direction, in the axial coma aberration corrector, so as to determine a value of the third excitation and a value of the fourth excitation to adjust the axial coma corrector.

11. The aberration correction method according to claim 10, further comprising determining whether or not a predetermined time has elapsed since the objective lens was adjusted, and adjusting the objective lens again in a case where it is determined that the predetermined time has elapsed.

12. The aberration correction method according to claim 8, wherein a region of a specimen to capture the electron microscope image is changed each time repeating the determining the standard deviation, the determining the optimum value, and the capturing the electron microscope image.

13. An imaging method comprising:

correcting aberration of the electronic optical system by the aberration correction method according to claim 8; and capturing an electronic microscope image having a number of pixels larger than a number of pixels of the electron microscope image which was captured in the capturing the electron microscope image.

14. An imaging method comprising:

correcting aberration of the electron optical system by the aberration correction method according to claim 8; and capturing an electron microscope image having an imaging magnification higher than an imaging magnification of the electron microscope image which was captured in the capturing the electron microscope image.

* * * * *